US008149070B2

(12) United States Patent
Albag et al.

(10) Patent No.: US 8,149,070 B2
(45) Date of Patent: Apr. 3, 2012

(54) CHOCKLESS POWER COUPLER

(76) Inventors: Yehezkel Albag, Nordia (IL); Olga Degtyarev, Lod (IL); Gavriel Magnezi, Givat Shmuel (IL); Yasis Shohet, Ramat-Gan (IL)

( * ) Notice: Subject to any disclaimer, the term of this patent is extended or adjusted under 35 U.S.C. 154(b) by 256 days.

(21) Appl. No.: 12/566,812

(22) Filed: Sep. 25, 2009

(65) Prior Publication Data

US 2010/0079218 A1 Apr. 1, 2010

Related U.S. Application Data

(60) Provisional application No. 61/100,543, filed on Sep. 26, 2008.

(51) Int. Cl.
*H03H 7/42* (2006.01)
*H01P 5/12* (2006.01)

(52) U.S. Cl. .......................................... 333/26; 333/127

(58) Field of Classification Search .................... 333/25, 333/26, 109, 110, 112, 115, 116, 128, 127
See application file for complete search history.

(56) References Cited

U.S. PATENT DOCUMENTS 3,504,306 A * 3/1970 Kam ............................... 333/26
4,674,868 A * 6/1987 Theimer ....................... 355/122
5,379,006 A * 1/1995 McCorkle ....................... 333/26
5,461,349 A * 10/1995 Simons ......................... 333/109
5,767,759 A * 6/1998 Rouet ........................... 336/174
6,466,770 B1 10/2002 Griffith et al.
6,741,814 B1 * 5/2004 Kosoff .......................... 398/140
7,170,463 B1 1/2007 Seavey
7,683,718 B2 * 3/2010 Dishop ......................... 330/276
7,714,581 B2 * 5/2010 Erickson et al. .............. 324/322
2003/0042992 A1 3/2003 Frank
2003/0104719 A1 6/2003 Murray
2003/0201873 A1 10/2003 Cern
2004/0168200 A1 8/2004 Richter et al.
2004/0189300 A1 9/2004 Burl
2005/0140460 A1 6/2005 Poirier et al.

OTHER PUBLICATIONS

Laird, Toroid and Balun Cores, 2011, on-line catalog, 5 pages.*
Amidon, Amidon Tech Data, 2007, on-line catalog, 4 pages.*
International Search Report of Application No. PCT/IL09/00925 mailed on Jan. 29, 2010.

* cited by examiner

*Primary Examiner* — Dean O Takaoka
(74) *Attorney, Agent, or Firm* — Pearl Cohen Zedek Latzer, LLP

(57) ABSTRACT

A wideband power coupler and method for taping part of a RF signal from a combined RF and AC signal with relatively simple structure and relatively low number of needed parts. The power coupler may include a BALUN, the BALUN constructed of a central conductor, an outer conductor and a ferrite element. Combined downstream AC and RF signal may flow through the central conductor of the BALUN. A part of the RF signal is reflected on the outer conductor of the BALUN with 180 degrees phase shift with respect to the RF signal, to create a reversed signal. Another part of the RF signal is sampled by a high pass filter. An autotransformer sums the reversed signal with the RF signal to create an output RF signal for an output tap port. When an upstream combined RF and AC signal flows through the BALUN, the phase of the RF signal reflected on the outer conductor of the BALUN is aligned with the phase of the RF signal sampled by the high pass filer such that the autotransformer cancels the upstream RF signal at the output tap port and the power coupler provides isolation to the output port.

28 Claims, 16 Drawing Sheets

Balun Equivalent Circuit

Layout

CHOCKLESS POWER COUPLER

CROSS REFERENCE TO RELATED APPLICATIONS

This Application claims the benefit of U.S. Provisional Application Ser. No. 61/100,543, filed on Sep. 26, 2008, which is hereby incorporated by reference in its entirety.

FIELD OF THE INVENTION

The present invention relates generally to a coupler that passes high frequency signals and AC power signals.

BACKGROUND OF THE INVENTION

In cable television systems, audio, video and data are distributed and collected through a coaxial cable network to and from the subscribers both directions, downstream and upstream. Simultaneously, alternating current ("AC"), typically 50 or 60 Hz power may be fed through the coaxial cables for powering trunk line amplifiers. A multi tap box connected on the main coaxial line of the network allows most of the RF signal to pass through it while, at one of its ports, a small portion of the RF signal is tapped and routed to a subscriber. A multi tap box is typically equipped with one main line input, one main line output and two or more tap ports.

Since the CATV (Cable Television) network is connected to many subscribers over the coaxial network, many taps should be connected to the main line. It is obvious that low loss through the main line of the multi tap box is essential to the network. At the same time, the frequency response should be as flat as possible i.e. as much as possible indifferent to the frequency. Any loss on the main line of the multi tap multiplies by the number of the multi taps on the line. The overall loss should be as small as a fraction of a decibel over the operational frequency range otherwise service degradation will result. As the number of taps used increases the higher the loss which results in non-flat response, a lower data rate inferior service quality.

Historically, multi tap designers struggled for many years to minimize the loss and to improve the flatness of the frequency response. Inside the multi tap box, at the main line input port, RF chocks and capacitors are typically used to separate the broadband RF signal from the AC power signal. The same arrangement is used for recombining the broadband RF signal with the AC power at the main line output port.

FIG. 1 illustrates a block diagram of a general prior art 5 to 1000 MHz legacy multi-tap device. The combined RF signal and AC power is applied from the main line coaxial distribution cable to the multi tap via main line IN connector 1. Inside the multi-tap device the RF power chock 3 bypasses the AC power to the main line distribution cable via main line output connector 2. The RF chock 3 designed very carefully to provide a relatively large impedance to the RF signal and low impedance and loss to the AC power. The AC power is not passed through other components and therefore only RF signal is passed through the other components of the multi tap device. The signal of about 5 to 1000 MHz flows from main line in connector 1 through capacitor 4, directional coupler 5 and capacitor 6 to the main line output connector 2. The high voltage capacitors 4, 6, protect the directional coupler 5 from the passage of AC power and is typically selected to provide relatively low impedance and low loss to the RF signal and high impedance to the AC power. Both the RF chock 3 and capacitors 4, 6, are selected carefully to provide low hum modulation to the RF signal flowing through the coupler 5.

The RF signal applied to main line in connector 1 passes through capacitor 4 to the input of directional coupler 5, which divides the RF signal into two portions. One portion of the RF signal flows to the main line connector 2 through capacitor 6. The second portion 7 is typically a smaller portion of the RF signal which flows to the legacy frequency 5 to 1000 MHz splitting section 8 which distributes the signal to tap ports 9, 10, 11, 12 and over to the subscribers drop lines. The signal splitting section 8 is typically built of (not shown) two way splitting cascaded hierarchical structure producing signals for 2, 4 or 8 etc. subscribers tap ports. Section 8 is shown with four tap ports but may be with 2, 4 or 8 ports, etc.

FIG. 2 illustrates a general prior art wideband multi-tap block diagram. The combined RF signal and AC power applied from the main line coaxial distribution cable to the multi tap via main line IN connector 13. The diplexer 21 divides the signal into two portions low and high frequencies. The low frequency portion passing the 5 to 1000 MHz to the main line out connector 20 through capacitor 15, coupler 16 and capacitor 17 and the low portion of diplexer 22. The AC current flows through RF chock 14 bypassing capacitors 15, 17 and coupler 16. The RF chock 14 is designed very carefully to provide a relatively large impedance to the legacy RF signal 5 to 1000 MHz and low impedance and loss to the AC power. The AC power is not passed through other components and therefore only RF signal is passed through the other components of the multi tap device. This arrangement is similar to legacy multi tap as described in FIG. 1.

The main line signal high frequency 1000 to 3000 MHz ultraband frequency range passing from connector 13 to connector 20 through the high portion of first diplexer 21 coupler 19 and the high portion of the second diplexer 22. The high pass portion of diplexers 21 and 22 includes high voltage capacitors blocking the AC voltage therefore no additional capacitors required.

The second portion 29 is the small coupled portion of the RF signal from the legacy coupler 16 and the second portion 30 of the ultraband RF signal from coupler 19 combined by the third diplexer 23 and fed through the common port 31 to the wideband 5 to 3000 MHz splitting section 24 distributing the signal to tap ports 25, 26, 27, 28 and over to the subscribers drop lines. The signal splitting section 24 is built of (not shown) two way splitting and re splitting hierarchical structure producing signal for 2, 4 or 8 subscribers tap ports. Section 24 is shown with four tap ports but may be with 2, 4 or 8 ports, etc.

The performance of the RF chock and capacitors is the main reason for the loss and flatness. Over the years the performance of multi tap devices have improved due to better RF chocks and better high voltage capacitors. However, by the time better RF chocks and capacitors became commonplace, CATV systems operators required higher frequency bands of operation; that is, frequency band of operation went from 250 MHz in the early days of cable TV to about 1000 MHz today making the multi tap design even more difficult.

The digital age introduced many new services such as internet, Internet protocol television (IPTV), digital video, high definition television broadcasting and video on demand. These services are bandwidth hungry requiring even higher data rates over the coaxial networks, more bandwidth and higher frequency bands of operation as well. To solve the ever increasing hunger for bandwidth cable operators relied on technological improvements such as higher modulation rate standards like QAM1024, video switching and the reuse of the bandwidth of some analog channels. However, these approaches are still not sufficient to satisfy the hunger for wider bandwidths. Also, as a consequence of the operation at higher bandwidth and frequency of operation, the linearity of the line amplifiers and their power consumption increased, requiring higher AC currents to flow through the coaxial network and the multi taps as well. These higher currents rose from 8 to 10, 12 and 15 A causing higher hum modulation as the current via the splitter tap of the multi tap device increased.

One of the proposed solutions for more bandwidth is to use the coaxial cable head end to generate higher frequency signals (i.e., beyond the 1000 MHz,) thus enabling it to carry more downstream and upstream content within a bandwidth that may be as broad as about 2000 MHz beyond the legacy frequency range, i.e. up to 3000 MHz. A main reason for the realization of the proposed solution is the design of new type of multi tap devices which can support a relatively higher frequency range. These multi tap devices were introduced few years ago and the cable industry's demand for these taps has increased over time. Generally, the new taps were built from well known low frequency couplers operating in the range of 5 MHz to 1000 MHz ("legacy") and another, higher frequency coupler that can operate in the 1250 MHz to 3000 MHz frequency range ("ultra band"). The signals from these couplers are separated and recombined by high frequency diplexers. The AC power passes through RF chock bypassing the lower frequency coupler section. This arrangement requires the use of many parts and complicated tuning procedures resulting in costly device.

The challenge is to create a new multi tap having high frequency performance where the use of chocks and capacitors is eliminated.

For example, a multi tap which eliminates the need for an RF chock and capacitors and a low power coupler. This new power coupler may replace the RF chock, capacitors and the low power coupler. The new power coupler can operate as a single coupler over a bandwidth as high as 5-3000 MHz and may provide low loss, good flatness, good return loss and high port to port isolation. At the same time it may pass through the main line a 15 A AC current with very low hum modulation, as required.

SUMMARY OF THE INVENTION

According to embodiments of the invention, a Balanced Unbalanced (BALUN) device may comprise a coaxial structure comprising a central conductor to allow a first signal and part of a second signal to flow thorough and an outer conductor, enclosing at least partially said central conductor, grounded at one side to reflect part of said second signal at substantially 180 degrees phase shift with respect to said first signal, and a first cylindrical ferrite element enclosing at least part of said coaxial structure to increase the inductance of said coaxial structure, wherein the length of the BALUN is about ½ wavelength of the highest frequency of the frequency range of the second signal.

According to embodiments of the invention, a chockless power coupler for taping part of a RF signal from a combined RF and AC signal may comprise a main line input port to receive an downstream signal from an input signal source, said downstream signal comprising a combined AC component and RF signal, a BALUN, wherein the first port of the central conductor of said BALUN is connected to said input port and the second port is connected to a main line output port, to allow said AC component and part of said RF signal to flow thorough said BALUN central conductor and to reflect part of said RF signal at substantially 180 degrees phase shift with respect to said RF signal on said BALUN outer conductor, wherein said BALUN outer conductor is coupled to a second circuitry. Said power coupler may further comprise a first circuitry coupled to said input port and to said first port of said BALUN central conductor to sample small part of said RF signal, a main line output port to receive said AC component and part of said RF signal to feed a main line distribution cable, said second circuitry, coupled to said BALUN outer conductor, to match impedances and improve the return loss of said RF signal and to pass said reflected RF signal to a third circuitry, said third circuitry coupled to said second circuitry and to said first circuitry to reverse the phase of said reflected RF signal received from said second circuitry and sum the reversed signal with the RF signal received from said first circuit and feed an output tap port with the summed RF signal, and an output tap port to feed splitting devices with said summed RF signal for the distribution of said summed RF signal to subscribers drop lines.

According to embodiments of the invention, RF signals reflected on said BALUN outer conductor of said power coupler from an upstream signal may substantially be in the same phase as the RF signals sampled by said first circuitry from said upstream signal, such that they may be substantially canceled by said third circuitry.

According to embodiments of the invention, said first circuitry of said power coupler may comprise a high pass filter comprising a resistor 56, also denoted as R1 and a capacitor 57, also denoted as C1, and wherein said second circuitry of said power coupler may comprise a network of capacitors and resistors, said network may comprise a resistor 53, also denoted as R2 connected to ground and a high pass filter comprising a resistor 55, also denoted as R3, and a capacitor 54, also denoted as C2, and wherein said third circuitry may comprise an autotransformer.

According to embodiments of the invention, a method for tapping part of a RF signal from a combined RF and AC signal may comprise receiving a downstream signal from an input signal source, said downstream signal comprising a combined AC component and a RF signal component, allowing said AC component and part of said RF signal to flow thorough a BALUN central conductor to create an output downstream signal, feeding a main line distribution cable with said output downstream signal, reflecting part of said RF signal at substantially 180 degrees phase shift with respect to said RF signal on said BALUN outer conductor to create a reflected RF signal, sampling part of said RF signal using a first circuitry to create sampled RF signal, matching impedances and reducing the return loss of said RF signal using a second circuitry, reversing the phase of said reflected RF signal to create reversed RF signal, and summing said reversed RF signal with said sampled RF signal using a third circuitry to create a summed RF signal.

According to embodiments of the invention, the method may further comprise receiving an upstream signal, said upstream signal comprising a combined upstream AC component and upstream RF signal, allowing said upstream AC component and part of said upstream RF signal to flow thorough a BALUN central conductor to create an output upstream signal, feeding a main line distribution cable with said output upstream signal, reflecting part of said RF signal of said upstream signal at substantially 0 degrees phase shift on said BALUN outer conductor to create an upstream reflected RF signal, sampling small part of said upstream RF signal using said first circuitry to create sampled upstream RF signal, reversing the phase of said reflected upstream RF signal to create a reversed upstream RF signal and summing said reversed upstream RF signal with said sampled upstream RF signal to substantially cancel said upstream RF signal at the output tap port.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
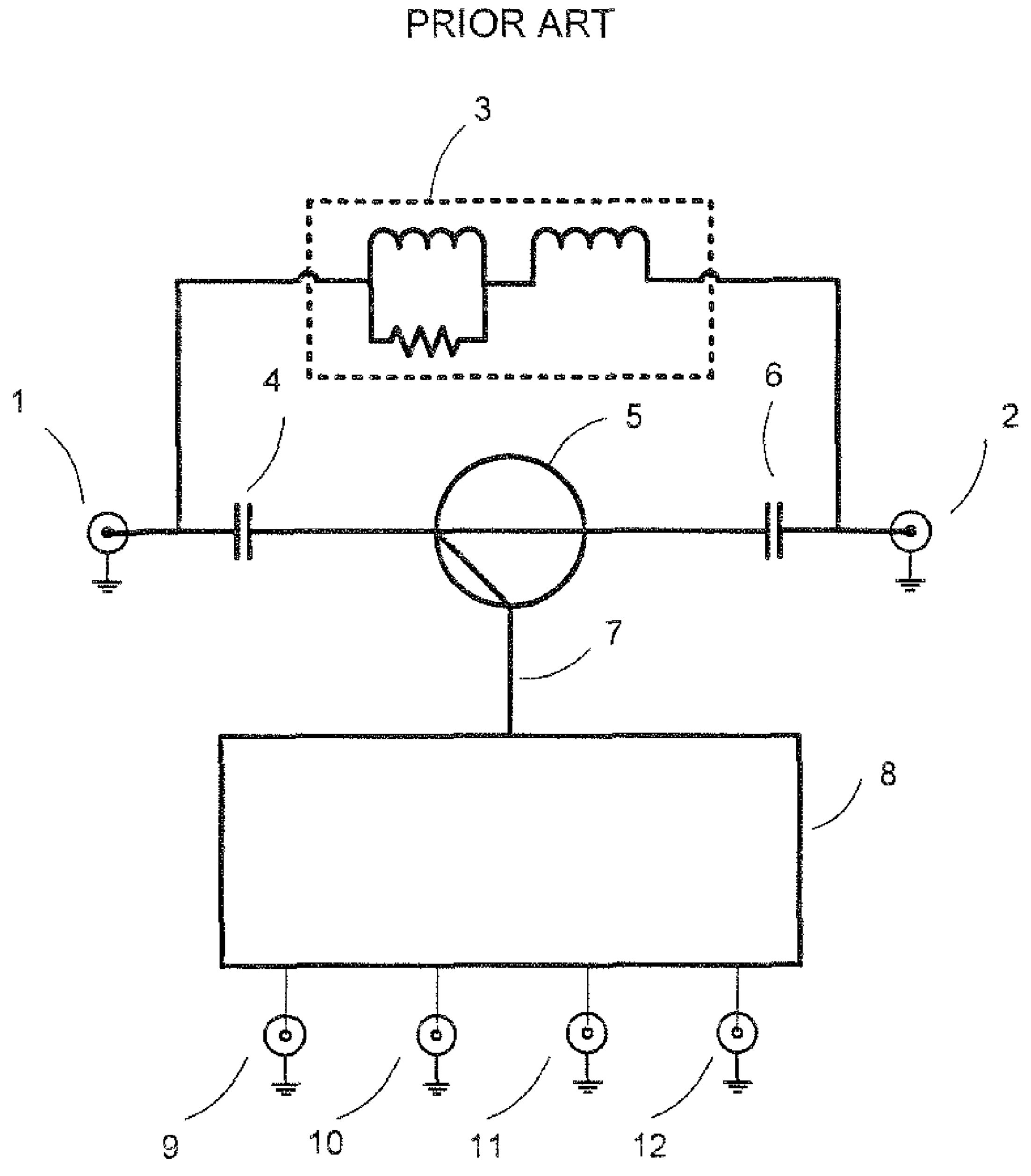
FIG. 1 is a schematic block diagram of a prior art CATV multi tap device with 4 output ports currently available up to about 1000 MHz, as known in the art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

A power coupler according to embodiments of the present invention enables transmission of wideband signals over existing CATV networks having downstream and upstream signals operating in the legacy frequency ranges of about 5 MHz to 1000 MHz and ultra band signals operating in the frequency band of about 1000 MHz to 3000 MHz. A power coupler of embodiments of the present invention also supports the transmission of AC power current feeding, for example, line amplifiers. A power coupler of embodiments of the present invention may be one of the main parts of a multi tap device that may be located at various points along a distribution cable where it is the connection point between the distribution cable and the drop cable which connects a subscriber to a CATV system or network.

Figure 2:
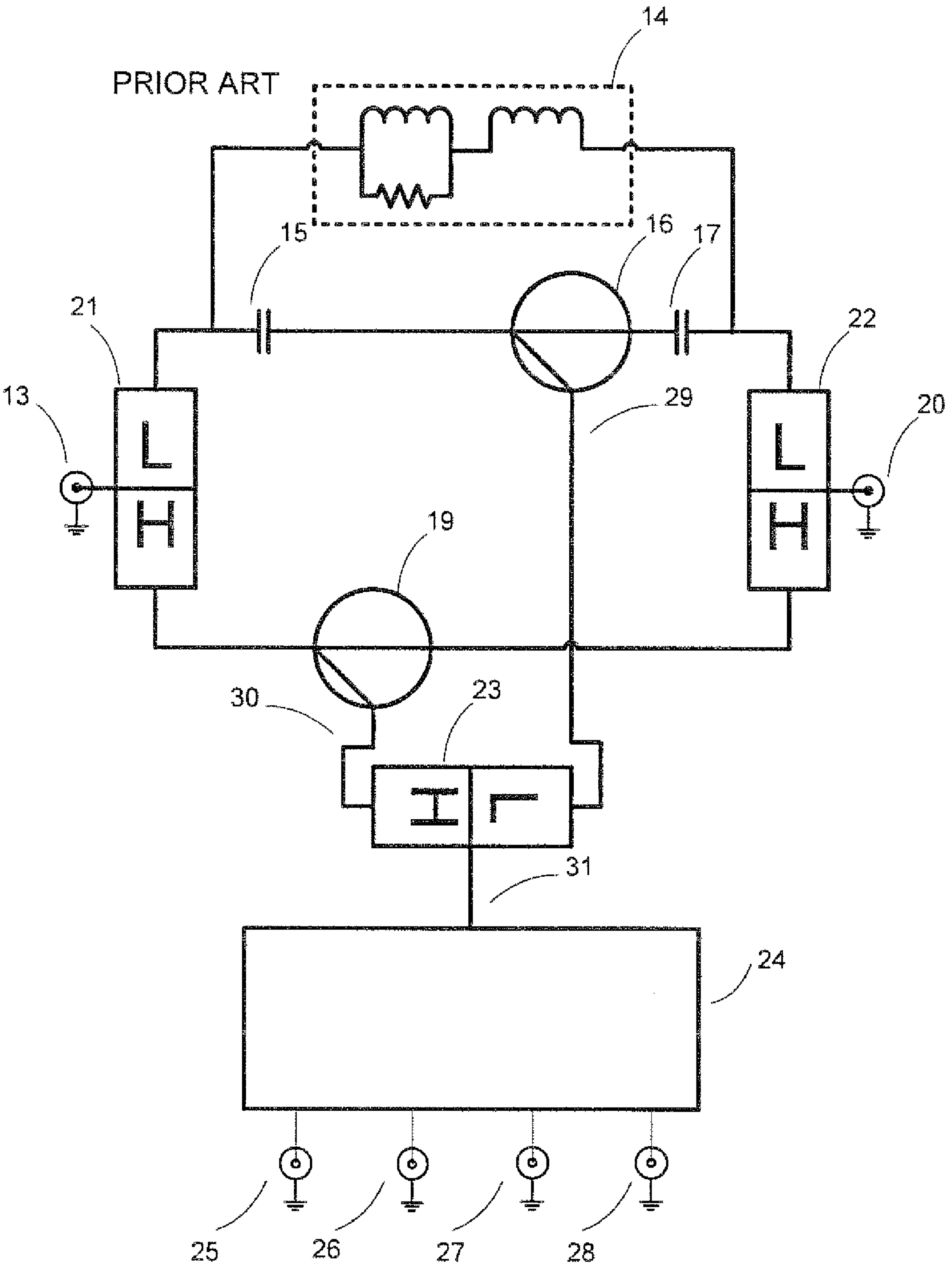
FIG. 2 is a schematic block diagram of a prior art CATV multi tap device with 4 output ports currently available up to about 3000 MHz, as known in the art.
Figure 3:
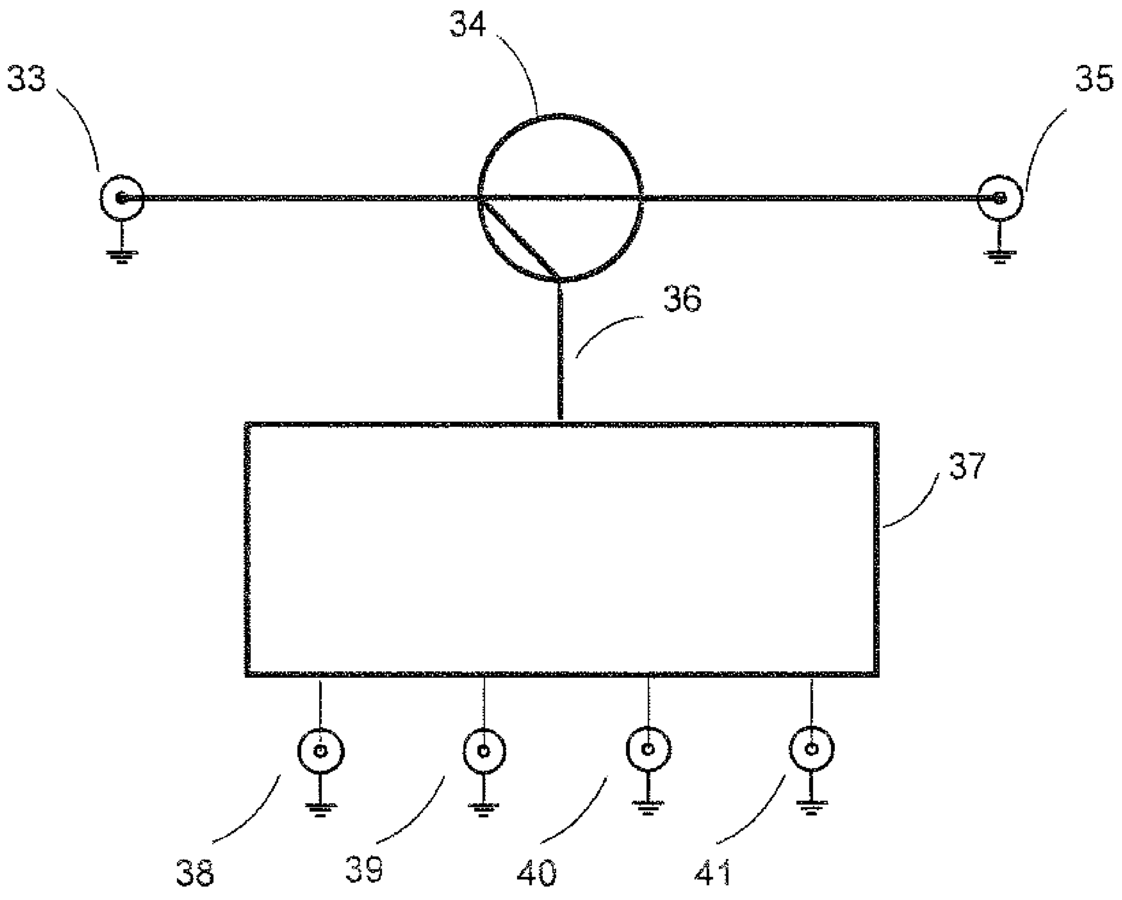
FIG. 3 is a schematic block diagram of a multi tap device with 4 output ports coupled to the power coupler according to embodiments of the present invention.

Referring to FIG. 3, there is shown a schematic block diagram of a four port multi tap device 37 connected to a power coupler 34 according to embodiments of the present invention. The combined RF signal (legacy and ultraband) and AC power may be supplied from a main coaxial line distribution cable to the multi tap via main line IN connector 33. Inside the multi-tap device a first portion of the input signal (at connector 33) having frequencies in the legacy frequency band of 5 MHz to 1000 MHz and the ultraband frequency may flow through the main line of the power coupler 34 (i.e., line connecting connector 33 to 35) to the main line distribution cable via main line output connector 35. At the same time the AC power may also flow through the same path, from connector 33 through power coupler 34 to output connector 35. The legacy signal is not separated from the AC power as in prior art configurations such as described in FIGS. 1 and 2. Furthermore, the legacy and ultraband RF signals are not separated by a diplexer as in the prior art configuration of FIG. 2. There is no need for diplexers or high voltage capacitors and RF chocks. The relatively simple structure and relatively low number of needed parts for the power coupler of embodiments of the present invention enables lower loss and improved frequency response flatness as compared to the prior art approaches. The lower part count results in lower labor for tuning and thus decreases the cost of a multitap product that uses the power coupler of embodiments of the present invention.

The second portion of the combined AC power signal, legacy signal and ultraband signal, from power coupler 34 appears on path 36. This signal, appearing on path 36, may thus be fed to the wideband 5 to 3000 MHz splitting device 37 which may distribute the signal to tap ports 38, 39, 40, 41 for example to subscribers drop lines. The signal splitting device 37 is built from two way splitting and re-splitting devices (not shown) producing signal paths for 2, 4 or 8 subscribers tap ports. Splitting device 37 is shown with four tap ports but may comprise 2, 4 or 8 ports.

Figure 4A:
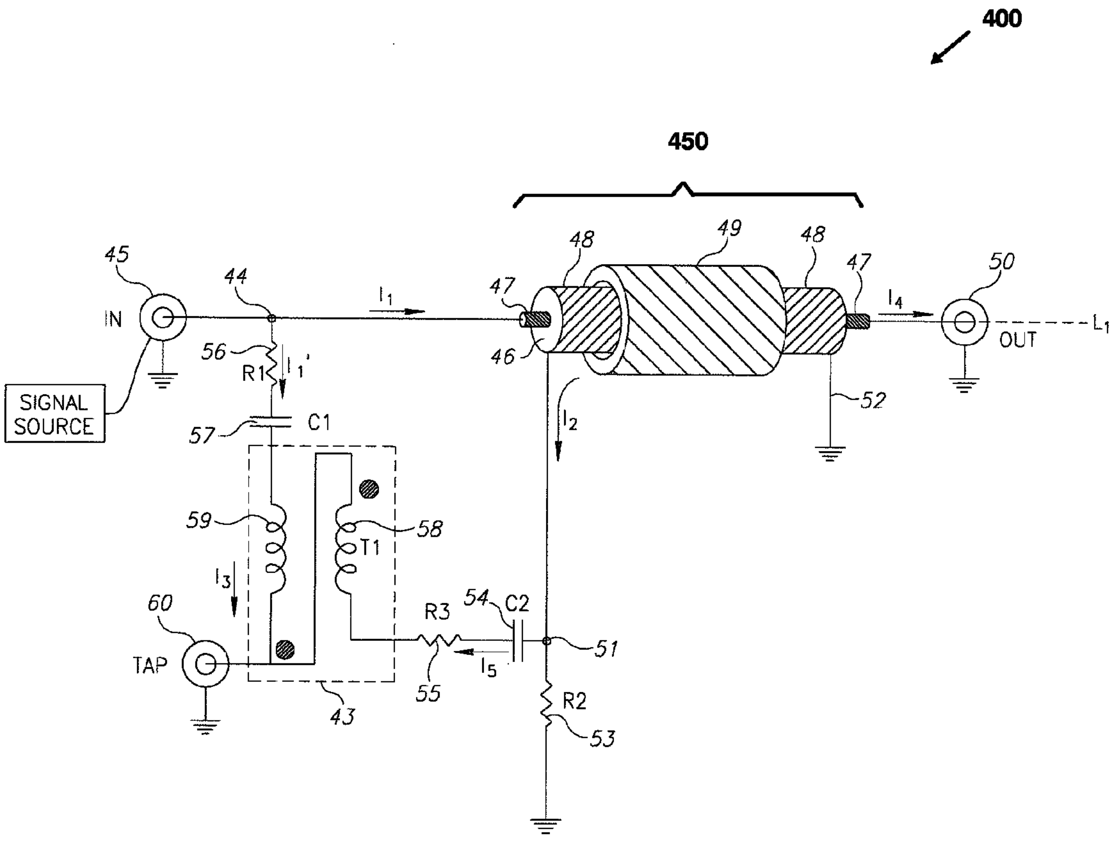
FIGS. 4A and 4B are schematic diagrams of one embodiment of a power coupler of the present invention.
Figure 4B:
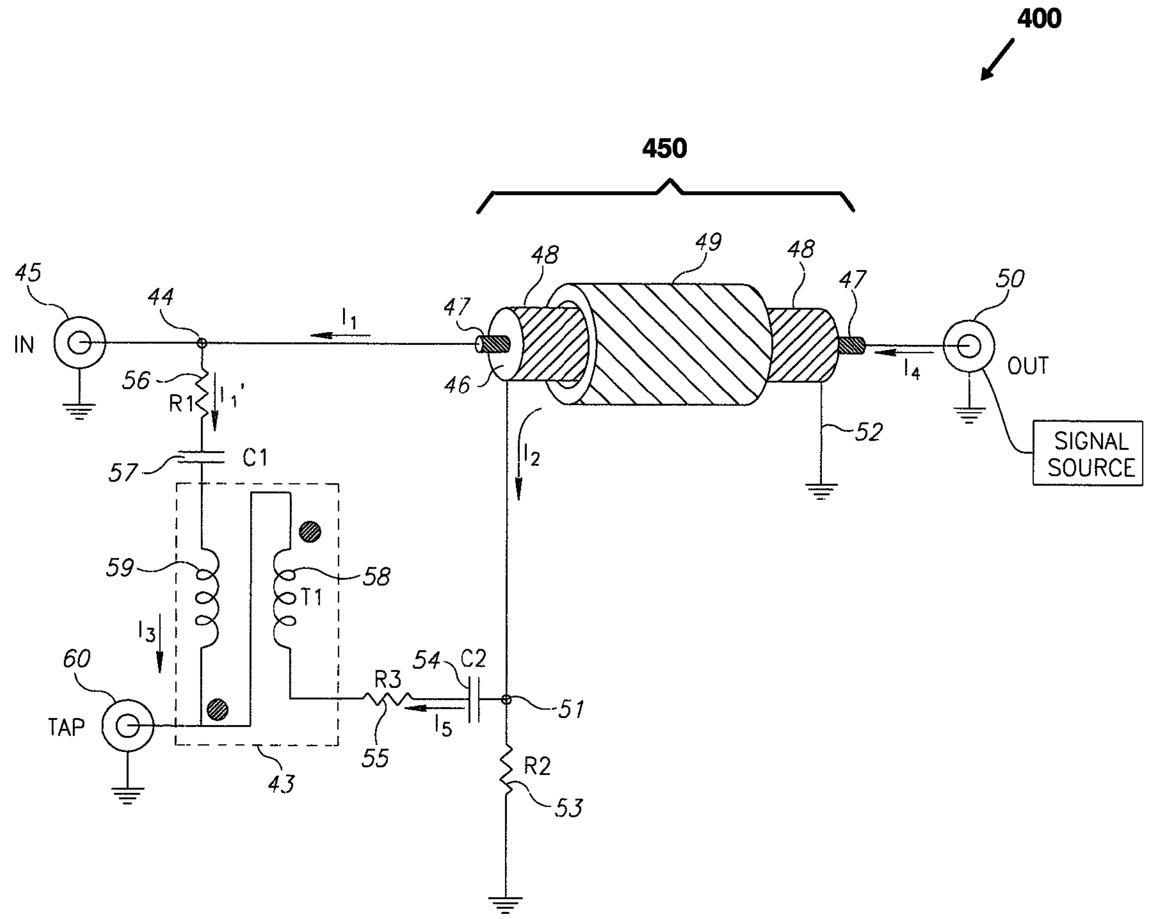

FIGS. 4A and 4B illustrate a schematic diagram of a power coupler 400 of embodiments of the present invention. Power coupler 400 includes a component 450 having a concentric arrangement of conductors, isolators and magnetic elements that comprise a coaxial structure 420 (not marked) comprising a center conductor 47, an outer conductor 48 and an isolation layer 46, and a magnetically permeable element 49. Conductor 47, outer conductor 48 and element 49 may be held isolated and apart from each other by isolation layer 46 and possibly one or more additional isolation arrangements (not shown), as may be needed. The combined RF signal and AC power are applied from the main line coaxial distribution cable to the multi tap via main line IN connector 45. For the sake of simplicity, the combined RF signal and AC power signal are shown as originating from a signal source. The combined RF signal and AC power may flow through center conductor 47 from the main input connector 45 to main line output connector 50. Component 450 of power coupler 400 may function as a wideband balanced to unbalanced adaptor structure usually called BALUN. The AC power passing from connector 45 to connector 50 only through the center conductor 47 and not passing through any other components and therefore only RF signal is passed through the other components.

BALUN 450 impedance may be exactly 75 ohms or close to 75 ohms so as to match the impedance of the main line coaxial cable connected to connectors 45 and 50. It should be noted that this design, including BALUN 450, may be modified and adapted for other impedances like 50 ohms or any other. Outer conductor 48 of coaxial structure 420 may be connected to the ground via conductor 52 at the end closer to main line OUT connector 50. At the other end of outer conductor 48, which is closer to main line IN connector 45, outer conductor 48 may be connected via conductor 51 to the ground through relatively small value resistor 53, also denoted as R2.

The ferrite cylinder element 49 may have an inner diameter large enough to be placed over outer conductor 48. Placing ferrite element 49 over outer conductor 48 may increase the inductance of outer conductor 48 to about 2 uH thus enabling BALUN 450 to operate at relatively low frequencies, as low as 5 MHz. For example, the outer conductor diameter may be about 6 mm and the ferrite cylinder element 49 inner diameter may be about 7 mm. It should be noted that air gap or insulator may or may not be inserted between the outer conductor 48 and the ferrite cylinder 49 in order to lower the loss at the highest operational frequency range of 5 to 3000 MHz.

The size of ferrite element 49 and its shape may be selected and designed carefully to achieve proper inductance, low loss and low hum modulation over a very wide frequency range, such as 5 to 3000 MHz. The ferrite material of the cylindrical shape element 49 may be selected for relatively high permeability in order to provide the required inductance in as small physical dimensions, such as length, as possible. At the same time the material of which ferrite element 49 is made should not saturate with AC currents as high as 15 A for best low-hum modulation performance. The ferrite material should be stable under outdoor temperature range such as from −40 C to +85 C keeping the power coupler performance stable at the required range of ambient temperatures. The electrical length of outer conductor 48 which is part of BALUN 450 may be about ½ wavelength of the highest operational frequency range of 5 to 3000 MHz, that is, for example, about 55 mm. The electrical length of ferrite element 49 is about ¼ wavelength of the highest operational frequency range of 5 to 3000 MHz, that is, for example, about 25 mm. As the frequency gets lower a longer electrical length for proper operation is required, the ferrite element 49 compensates the relatively short physical length of the coaxial structure 420, keeping the effective electrical length of BALUN 450 close to ½ wavelength for lower frequencies as 5 MHz, which may be the lowest frequency range of the operational frequency.

According to embodiments of the invention, resistor 56, also denoted R1, is connected at connection point 44 to the main line signal IN connector 45. Resistor 56 may be of relatively high resistance and thus only slightly loading the signal at connection point 44. The signal sampled by resistor 56 may be relatively in lower level and same phase with respect to the signal at point 44. The sampled signal of resistor 56 flows through high voltage capacitor 57, also denoted C1, to the high impedance winding 59 of the wideband matching auto transformer 43. Sampled signal from connection point 51 through capacitor 54, also denoted C2, and resistor 55, also denoted R3, is applied to the low impedance winding 58 of the wideband matching autotransformer 43. Capacitor 54 may be low voltage and low cost capacitor since no high AC voltage or surge exist or developed over its ports. The purpose of this capacitor is to improve the return loss at about 5 MHz low frequency range. Example for proper capacitor 54 may be 1000 pF general use X7R ceramic capacitor. Alternatively, with careful design and proper selection of the other components values and autotransformer 43 windings, capacitor 54 may be eliminated.

Capacitor 57 may be selected carefully for high voltage operation as high as 90 VAC, 60 Hz to provide stable capacitance value over the AC voltage range while keeping the hum modulation low. The capacitance value of this capacitor should be as low as possible in order to lower the parasitic inductance sometime exists in higher value capacitors. Yet, the capacitance of capacitor 57 should not be too low in order to allow passing of the lowest operational frequency of 5 MHz. Example for proper capacitor may be 1000 pF polyester or COG ceramic capacitor. It should be noted that capacitor 57 may be much smaller in value than the 10000 pF high voltage capacitors 4 and 6 in the prior art configuration presented in FIG. 1; also, for capacitors 15 and 17 in prior art configuration of FIG. 2. This is because, resistor 56 and secondary 59 in series with capacitor 57 provide high impedance in series which lowers the loss and improves the flatness over the operational frequency range 5 to 3000 MHz. This high impedance eases the stress of capacitor 57 when high surge voltage, as high as 6 kv combination wave occurs over IN connector 45 or OUT connector 50.

The phase of the RF signal developed at point 51 is different if applied from connector 45 or if applied from connector 50. When applied from IN connector 45, the phase of the signal reflected to the outer conductor 48 and developed at point 51 is in the opposite phase in relation to the phase of signal at point 45, since the electrical length of the center conductor 47 and the outer conductor 48 is substantially ½ wavelengths. So, for example, when the phase of the signal at point 44 is 0° (zero degrees), the phase of the signal at point 51 reflected to the outer conductor is 180° (degrees) which is the opposite phase related to point 44. Auto transformer 43 reverses the phase and sums the signals applied from connection point 44 and connection point 51 and provides the sum to the tap port 60. Tap port 60 is the second portion 36 in FIG. 3 tapping the small coupled portion of the combined legacy and ultraband RF signal from the main line to the splitting and re splitting hierarchical structure producing signal for distributing the signal to tap ports to the subscribers drop lines.

In the upstream direction the signal from connector 50 flows through the center conductor 47 to connector 45 undergoing the same loss as occurs with a downstream flow from connector 45 to connector 50. The signal that flows from connector 45 to tap port 60 may provide the tap loss, which may be selected, for example, as 4.5, 8, 10, 13 or 16 dB according to embodiments of the invention. However, it is different with a signal which is applied to connector 50 (upstream signal) and may flow to the tap port 60. This signal flows through the center conductor 47 so the phase at point 44 is positive while the signal reflected to the outer conductor 48 and developed at point 51 is positive as well since the electrical length of the center conductor 47 and the outer conductor 48 is substantially ½ wavelengths. So if the phase of the signal at point 44 is 0° (zero degrees), the signal at point 51 reflected to the outer conductor is 0° (degrees) which is in the same phase as point 44. Auto transformer 43 reverses the phase and sums the signals applied from connection point 44 and connection point 51 and provide the differences to the tap port 60. The result is that the signal applied to out connector 50 is substantially canceled at the tap port 60, thus providing the isolation as required in CATV multi tap devices. Tap port 60 is the second portion 36 of FIG. 3 tapping the small coupled portion of the combined legacy and ultraband RF signal from the main line to one or more splitting units cascaded in a hierarchical structure producing distributed signal for the tap ports along with proper tap to tap isolation to the subscribers drop lines. The tap port 60 may be matched for 75 ohms or 37.5 ohms for some of the power coupler values.

Reference is made to Table 1, which presents the values of autotransformer T1 windings ratio and values of the resistance of resistors 56, 53 and 55 and the resulting tap 60 impedance of FIG. 4 as a function of the required attenuation for the tap, according to embodiments of the invention. As an example the 4.5 dB coupling value can be seen in Table 1. When matched for 37.5 ohms the first matching transformer required for the first splitter stage part of the hierarchical splitting section 37 in FIG. 3 is no longer required and may be eliminated resulting lower loss to the tap ports as well as lower loss on the main line since higher coupling ratio may be selected for the power coupler getting the same RF signal level at the tap ports.

The multi tap device of embodiments of the invention may include a number of tap ports selected from a series of available ports number and tap off values selected from a number of values. A two way multi taps device may include tap values selected, for example, from the values 4, 8, 11, 14, 17, 20, 23, and 26. The 4 way multi taps device may include tap values selected, for example, from the values 8, 11, 14, 17, 20, 23, and 26. The 8 way multi taps device may include tap values selected, for example, from the values 11, 14, 17, 20, 23, and 26. The multi tap device therefore may include at least 21 different models. All the above multi tap embodiments may be built with as few as 5 different values of attenuation of power coupler 34 comprising 4.5, 8, 10, 13 and 16 dB. Different values of resistors 56 (R1) 53 (R2) and 55 (R3) and different primary to secondary ratio of the windings of autotransformer 43 (T1) may be required. Table 1 summarizes these values:

TABLE 1

Resistors value and transformer turns selected for TAP attenuation values

| | Attenuation | | | | |
|---|---|---|---|---|---|
| Parts | 4.5 dB | 8 dB | 10 dB | 13 dB | 16 dB |
| Transformer Turns Ratio | 1/1 | 1/1.5 | 1/2 | 1/3.5 | 1/4.5 |
| R1 Ω | 0 | 60 | 60 | 60 | 82 |
| R2 Ω | 27 | 56 | 106 | 106 | 118 |
| R3 Ω | 33 | 31 | 21.5 | 15 | 10.5 |
| Tap imp Ω | 37.5 | 75 | 75 | 75 | 75 |

A detailed analysis of the operation of the circuitry in FIGS. 4A and 4B follows: According to embodiments of the invention, power coupler 400 is implemented with a BALUN 450 having a particular characteristic impedance with various electrical components attached as shown. In the embodiment of the power coupler 400 of the present invention shown in FIG. 4, the electrical components are mounted on a printed circuit board (not shown in FIG. 4) and are electrically connected to BALUN 450 as shown. Coaxial structure 420 comprises inner conductor 47, outer conductor 48 and insulating material 46. A cylindrical shaped ferrite element 49 is positioned to surround at least a portion of coaxial structure 420 along its longitudinal axis. The purpose of the cylindrical shaped ferrite element 49 is discussed infra.

A signal source generating an RF signal having frequency components in the range of at least 5 MHz to 3 GHz (hereinafter "the RF signal") and a 15 Amp 60 Hz AC signal is applied to input connector 45 as shown. It should be noted that the power coupler of embodiments of the present invention can operate for other frequency ranges of RF signals and other AC currents. The particular RF signal and AC signal characteristics mentioned are used as examples only to facilitate the description of the operation of the power coupler of embodiments of the present invention. It will therefore be readily understood that the operation of the power coupler of embodiments of the present invention is not limited to the particular RF and AC signal characteristics mentioned above.

The power coupler 400 of embodiments of the present invention operates as follows. A current I1 representing the combination of the AC signal and the RF signal appears on inner conductor 47 of a coaxial structure 420 having outer conductor 48. The inner conductor 47 is separated from the outer conductor 48 by insulating material 46. Additionally, a cylindrical shape ferrite element 49 physically encompasses coaxial structure 420 along its longitudinal axis (L1) as shown. Current I1 flows through coaxial structure 420 via inner conductor 47 and appears at output connector 50 as current I4. Current I4 may not equal current I1 due to insertion loss and other losses as I1 propagates through coaxial structure 420. As a result of the flow of current I1 in the direction shown (i.e., from input connector 45 to output connector 50) a reflective current I2 of relatively smaller amplitude with respect to I1 and 180° out of phase with I1 flows in a direction opposite that of I1 on outer conductor 48. From the schematic, it will be understood that currents I1. I4 and I2 each contain a combination of the AC signal and the RF signal; each such signal may have different amplitudes and phases relative to each other. The power coupler of embodiments of the present invention is able to separate the RF signal (e.g., signal having frequency components in the range of 5 MHz to 3 GHz) from the AC signal with the use of at least two tap points and the circuitry as shown.

In particular, at one tap point 44, part of the current I1 is tapped via resistor 56 resulting in current $I'_1$ flowing through resistor 56 and capacitor 57. Capacitor 57 acts to block the AC power signal component of $I'_1$; that is, the resistor 56-capacitor 57 (R1-C1) combination acts as a high pass filter which filters out the AC power signal component of $I'_1$ since the impedance value of resistor 56-capacitor 57 (R1-C1) combination is a relatively high for the frequency of the AC power. For example, the impedance of resistor 56 and capacitor 57 may be in the range of MΩ (mega Ohms) for AC current and hundred Ω for the 5 MHz signal which is the low end of the RF operational frequency range. After current $I'_1$ flows through capacitor 57, it results in current I3 which flows through coil 59 of transformer 43.

At the other tap point 51, part of the reflective current I2 flows through resistor 53 and another portion of current I2 flows through the resistor 55-capacitor 54 (R3-C2) circuit resulting in current I5 which has no AC signal component; The resulting current I5 flows through coil 58 of transformer 43.

Transformer 43 comprises two coils 58 and 59 each wound around ferrite material (not shown) and connected such that the input to coil 58 is 180° out of phase with the input to coil 59. Transformer 43 serves to add current I3 with a 180° out of phase versus of current I5 which itself is already 180° out of phase with current I3. Therefore, because of the manner in which the current I5 and 13 are applied to transformer 43, the two currents added in phase to each other resulting in a current sum of I3+I5 at connector 60. Transformer 43 sums and reflects the impedance at tap port 60 through resistor 56-capacitor 57 to point 44 and through resistor 55-capacitor 54 to point 51, through its winding ratio of coils 58 and 59 resulting in an impedance of 75 or 37.5 ohms according table 1. According to embodiments of the invention, and as described above, the high power AC current is substantially filtered out form I1' and I5. Therefore, transformer 43 may be relatively small in size. For example, transformer 43 may be few millimeters wide by few millimeters long. Using such a small size transformer may improve transformer 43 functionality especially at the high end of the RF frequency range, for example the insertion loss, return loss and flatness over the range of 5 MHz to 3 GHz and may also reduce the cost of the device.

Filtering out the high current AC component and coupling the RF component using a small form factor transformer may improve (i.e. decrease) the overall unit-loss of power coupler 400 according to embodiments of the present invention. Decreasing the unit-loss of a single coupler is beneficial for some applications, for example CATV (cable TV) applications, in which typically many such couplers are cascaded along a single transmission path and thus the loss of one coupler is likely to be multiplied many times along the transmission path.

It should be noted that component 450 of power coupler 400 of embodiments of the present invention acts as a BALUN because its input has a differential signal (i.e., I1 and I2) and its output has one signal referenced to ground (i.e., I4); that is, the outer conductor of coaxial structure 420 is grounded at the output, but is connected to ground through resistor 53 (that may have relatively small resistance, e.g., few Ω) at tap point 51 as discussed above. The value of resistor 53 may be selected to provide proper RF signal level as required at point 51. Small resistor 53 value results in a small RF signal reflected over the outer conductor 48 at point 51. Thus, small resistor 53 values may be selected for RF signal level or low tap off values and higher resistor 53 values may be selected for high RF signal level or tap off values, as seen in table 1. The characteristic impedance of coaxial structure portion 420 of power coupler 400 of embodiments of the present invention can be designed to be 75 ohms or 50 ohms or any other desirable value.

In addition to the circuitry appearing in FIG. 4 and described above, a cylindrical shaped ferrite element 49 is positioned so as to surround at least a portion of coaxial structure 420 of power coupler 400 of embodiments of the present invention to increase the inductance of coaxial structure 420 for a particular length of the structure; this enables coaxial structure 420 to operate at low frequencies (say at 5 MHz or lower). A ferrite material of relatively high permeability is selected to cause the increased inductance of coaxial structure 420. Also, the selected ferrite material should not saturate due to the amplitude of the AC signal; this promotes relatively very low "hum modulation" or the modulation of the RF signal from the relatively large AC signal. Ferrite element 49 may include an air gap across at least portion of the magnetic flux in said ferrite element (not shown) to limit the saturation level and therefore reduce the hum modulation. Further, the selected ferrite material should have stable operation in a temperature range of −40° C. to +85° C. to allow power coupler 400 of embodiments of the present invention to have stable operation at required range of ambient temperatures that fall within the temperature range above. For example, the ferrite material selected for ferrite element 49 may be Steward 28 or Steward 46. Ferrite material Steward 28 may be $(NiZn)Fe_2O_4$ and may have nominal permeability of 800 at low frequency such as 5 MHz. Ferrite material Steward 46 may be $(MnZn)Fe_2O_4$ and may have nominal permeability of 4000 at low frequency such as 5 MHz. The length of coaxial structure 420 may be equal to about ½ wavelength for the operational frequency range of the power coupler of embodiments of the present invention. For the operational range of 5 MHz to 3 GHz, the length should be about 55 millimeters.

Because the RF signal is tapped off and not separated from the AC signal with the use of RF chocks, the frequency response of the power coupler of embodiments of the present invention is relatively flat for a relatively wide band of operation (e.g., frequency range of operation of 5 MHz to 3 GHz) with virtually no "bumps" (amplitude variation in the frequency response for one or more group of frequencies). Further, the use of the ferrite material with characteristics as described above allows relatively low hum modulation even for relatively large AC currents (e.g., 15 amps or more) and stable operation at the lower frequency end of the frequency range (e.g., 5 MHz) of operation.

Figure 5A:
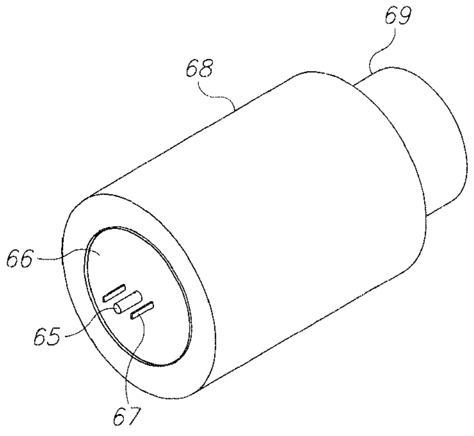
FIGS. 5A and 5B are perspective views of two possible embodiments of a balanced-unbalanced (BALUN) part of a power coupler of the present invention.

Referring now to FIG. 5A, which illustrates an isometric view of the balanced to unbalanced BALUN element of power coupler 34 of FIG. 3 according to embodiments of the invention. The embodiment shown here is a straight coaxial structure comprising center conductor 65, isolator 66, isolator 69, outer conductor 67 and cylindrical element 68 made for example of ferrite material. Center conductor 65, isolator 66, isolator 69, outer conductor 67 and cylindrical element 68 are substantially concentric with each other.

Figure 5B:
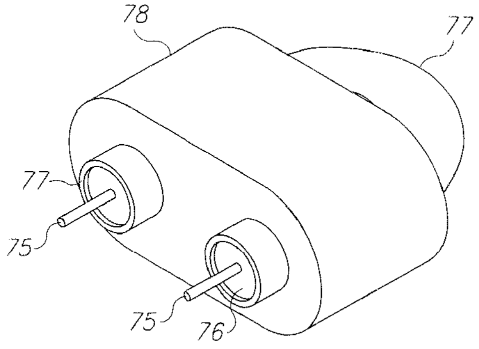

Referring now to FIG. 5B, which illustrates an isometric view of the balanced to unbalanced BALUN part of the power coupler according to another possible embodiment of the invention. The embodiment shown here is a bended coaxial structure comprising a center conductor 75, isolator 76, outer conductor 77 and double aperture element 78 made for example of ferrite material.

Figure 6A:
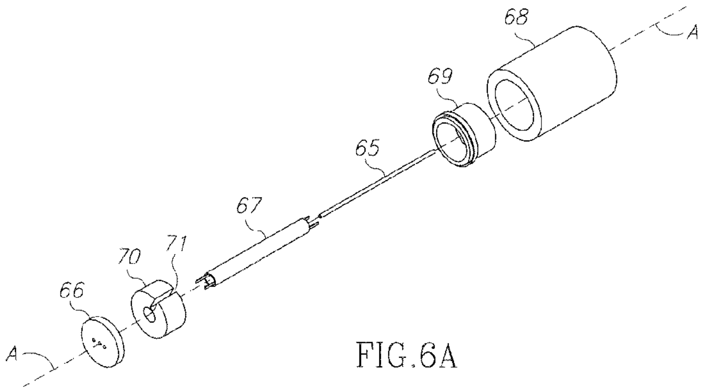
FIGS. 6A and 6B show exploded views of two possible embodiments of the BALUN part of a power coupler of the present invention.
Figure 6B:
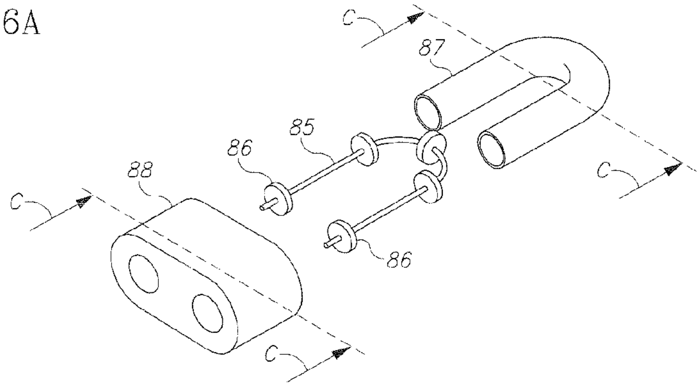

Referring now to FIGS. 6A and 6B, which illustrate an exploded view of the balanced to unbalanced BALUN part of FIGS. 5A and 5B respectively, according to embodiments of the invention. The embodiment shown in FIG. 6A is a straight coaxial structure comprising a center conductor 65, an isolator 66 and isolator 69, an outer conductor 67 and a cylindrical ferrite element 68. The center conductor 65 may be made of a high conductivity metal for example silver plated copper, with proper diameter, such as 1 mm or higher, designed for high AC current such as, for example 15 A AC current and for low AC power loss. Center conductor 65 is the only part which carries and transfers through the AC power from IN connector to OUT connector. The center conductor 65 may be soldered to a Printed Circuit Board (PCB) at both edges. Outer conductor 67 may be made of a metal pipe designed for about 75 ohms enclosing concentrically centered conductor 65. The outer diameter of pipe 67 may be kept as small as possible to lower the parasitic capacitance to the ferrite cylinder 68 and lower the RF signal loss flowing across the coaxial structure therefore there may be no insulator between the center conductor and outer conductor but air. The cylindrical element 68 has input diameter which is relatively larger then the outer diameter of the coaxial outer conductor 67 to lower the parasitic capacitance over the outer conductor 67 and therefore lower the loss at high frequencies of the operational frequency range 5 to 3000 MHz. Element 68 made of ferrite material has relatively lower permeability then the other ferrite element 70 and intended for operation in higher frequency range such as 50 to 400 MHz. The isolation part 66 may mechanically hold or support coaxial center conductor 65, outer conductor 67 and ferrite element 70. Isolation part 69 may mechanically hold coaxial center conductor 65, outer conductor 67 and ferrite cylinder element 68. Both isolators 66 and 69 may be made of low loss and high isolation material such as Teflon and may be placed on the edges of the coaxial structure keeping for example air as insulator between coaxial center conductor 65, outer conductor 67 and cylindrical ferrite element 68. Additional to that, not shown in FIG. 5A is another cylindrical ferrite element 70 with air gap 71. This element 70 made of ferrite material has relatively higher permeability then the other ferrite element 68 and intended for operation in lower frequency range such as 5 to 50 MHz. Cylindrical ferrite element 70 may include air gap 71 to improve the saturation level and therefore reduce the hum modulation. It should be noted that the overall inductance of ferrite element 70 and ferrite element 68 should be about 2 uH to enable proper operation at lowest frequency of the operational frequency range near 5 MHz. If the cylindrical ferrite element 68 provides the required inductance then ferrite 70 may be eliminated and removed from the design. It also should be noted that both ferrite elements 68 and 70 may or may not have air gap and the ferrite material selected for both ferrite elements 68 and 70 may be Steward 28 or Steward 46.

Referring now to FIG. 6B which illustrates an exploded view of the balanced to unbalanced BALUN part of the power coupler according to another embodiment of the invention, as shown in FIG. 5B. The embodiment shown here is a bended coaxial structure comprising center conductor 85, isolators 86, outer conductor 87 and double aperture ferrite element 88.

Figure 7A:
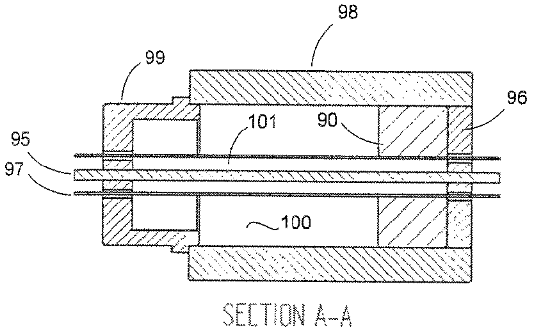
FIGS. 7A and 7B show cross sectional views of the two embodiments shown in FIGS. 6A and 6B along section lines A-A and C-C, respectively.
Figure 7B:
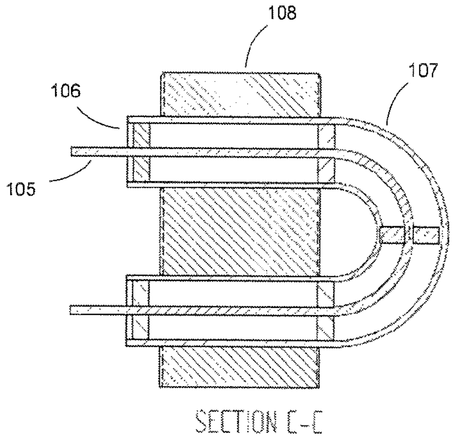

Referring now to FIGS. 7A and 7B which illustrate cross sectional views of the balanced to unbalanced BALUN parts of the power coupler according to embodiments of the invention, in accordance with FIGS. 5A, 5B and 6A, 6B, respectively. The embodiment shown here in FIG. 7A is a straight coaxial structure includes center conductor 95 isolator 96 isolator 99 outer conductor 97 and cylindrical shape ferrite material 98. The center conductor 95 made of metal for example copper plated with silver with proper diameter as 1 mm designed for low AC power loss. This center conductor is the only part which handles and pass through the AC power from IN to OUT connectors. The center conductor 95 may be soldered to the PCB at both edges. The outer conductor 97 may be a metal pipe designed for about 75 ohms related to the center conductor 95 and may be soldered on both edges with two tabs on each side. The outer diameter of the pipe 97 may be kept small as possible to lower the parasitic capacitance to the ferrite cylinder 98 and lower the RF signal loss flowing across the coaxial structure therefore there is no insulator between the center conductor 95 and outer conductor 97 but air 100. The lower permeability cylindrical ferrite 98 input diameter may be relatively larger then the outer diameter of the coaxial outer conductor 97 to lower the parasitic capacitance over the outer conductor 97 and therefore lower the loss at high frequencies of the operational frequency range 5 to 3000 MHz. The isolator part 96 may hold mechanically the coaxial center conductor 95 the outer conductor 97 and the ferrite 90. The isolation part 99 may mechanically hold the coaxial center conductor 95 the outer conductor 97 and the cylindrical ferrite 98. Both isolators 96 and 99 may be made of low loss and high isolation material such as Teflon and may be placed on the edges of the coaxial structure keeping air 101 as insulator between the coaxial center conductor 95 outer conductor 97 and the cylindrical ferrite 98. Additional to that, not shown on FIG. 5*a*, there may be another cylindrical ferrite shape 90 with air gap (not shown). This higher permeability ferrite material intended for operation in the lower frequencies of the operational frequency range 5 to 3000 MHz. The part may include air gap (not shown) to improve the saturation level and therefore improved the hum modulation.

Additional requirement for the multi tap device is to handle surges and have a surge protection. An example of this requirement is described in "Surge withstand test procedure" ANSI/SCTE 81/2003 published by the SCTE. It should be noted this test procedure relates to legacy frequency range of 5 to 1000 MHz only and that embodiments of the current invention includes a power coupler designed for frequency range of 5 to 3000 MHz. Embodiments of the present invention may answer this requirement. The coaxial structure center conductor 95 and outer conductor 97 may be separated by air. This air gap may function as insulator and also as surge gap handling the 6 kv combination wave as required in the SCTE document protecting the other parts of the multi tap device.

FIG. 7B illustrates a cross sectional view of the balanced to unbalanced BALUN part of the power coupler according to another possible embodiment of the invention. The embodiment shown here is a bended coaxial structure includes center conductor 105 isolators 106 outer conductor 107 and double aperture shape ferrite material 108.

Figure 8A:
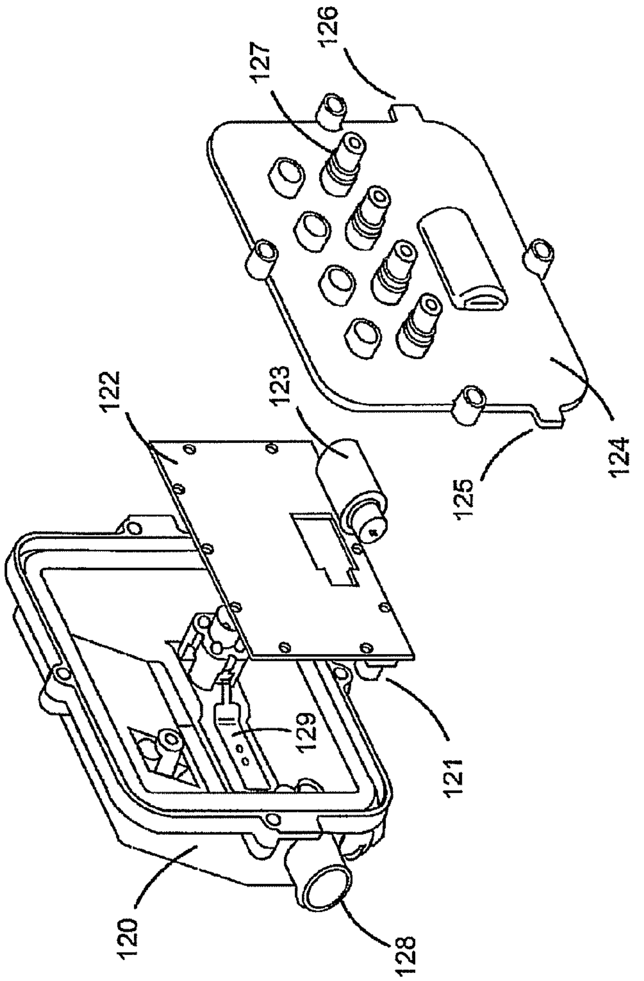
FIGS. 8A, 8B and 8C show a power coupler in a multi tap device mechanical housing in accordance with an embodiment of the present invention.
Figure 8C:
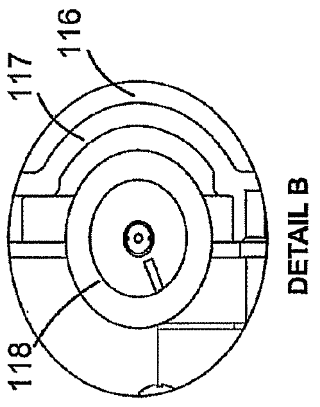
Figure 8B:
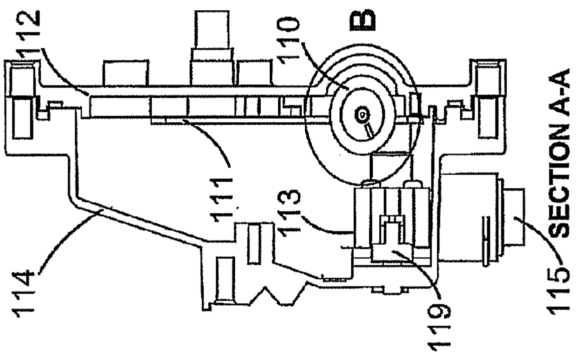

Reference is now made to FIGS. 8A, 8B and 8C. FIGS. 8B and 8C show a cross sectional view of the balanced to unbalanced BALUN part of the power coupler of embodiments of the present invention, according to the implementation placed inside an exemplary complete multi tap housing shown in FIG. 8A. The BALUN 110 may be placed on the PCB 111 assembled on the face plate housing 112. Detailed cross sectional view shown at 116. The face plate housing 117 may be made of molded metal creates coaxial structure for matching over the ferrite 118 cylindrical part of the power coupler BALUN. The IN and OUT main line 3000 MHz connectors 113 may carry the RF signal and AC power connecting the face plate PCB 111 to the multi tap housing 114. Also shown are the 3000 MHz 15 A make before break (MBB) transmission line 119 and 129 used to connect the IN to OUT main line female connectors bypassing the legacy and ultraband RF signal and the AC power replacing and stimulating the face plate 112 when it removed for maintenance. The main line coaxial cable connectors may be connected to 128 and 115 (environmental covers shown).

In the perspective view of the multi tap housing it is clearly shown that the housing 120 with the 3000 MHz female connectors and the MBB transmission line 129 is connected between them when the face plate 124 detached. The 3000 MHz male connectors 121 and the power coupler BALUN 123 may be assembled on the PCB 122. The face plate 124 in the example of FIG. 8A has four tap F type connectors 127 assembled on it. Also shown on the face plate are the marking of the main line IN 125 and main line OUT 126. BALUN 123 may be carefully placed relatively to face plate 124 to decrease possible interferences in the RF frequency range of 5 MHz to 3000 MHz.

Figure 9:
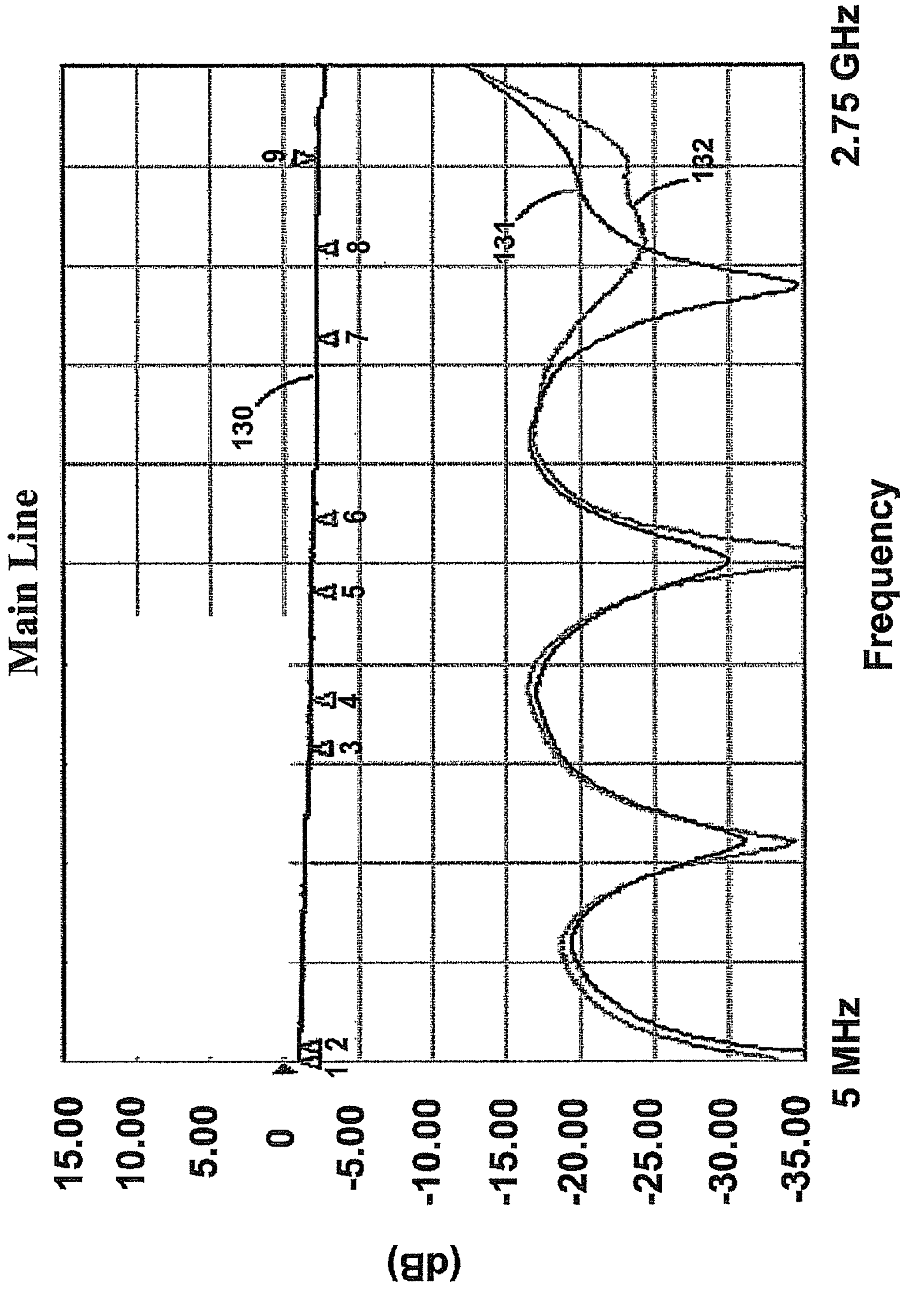
FIG. 9 is a graph of the main line IN to main line OUT insertion loss versus frequency of a power coupler according to embodiments of the present invention.
Figure 10:
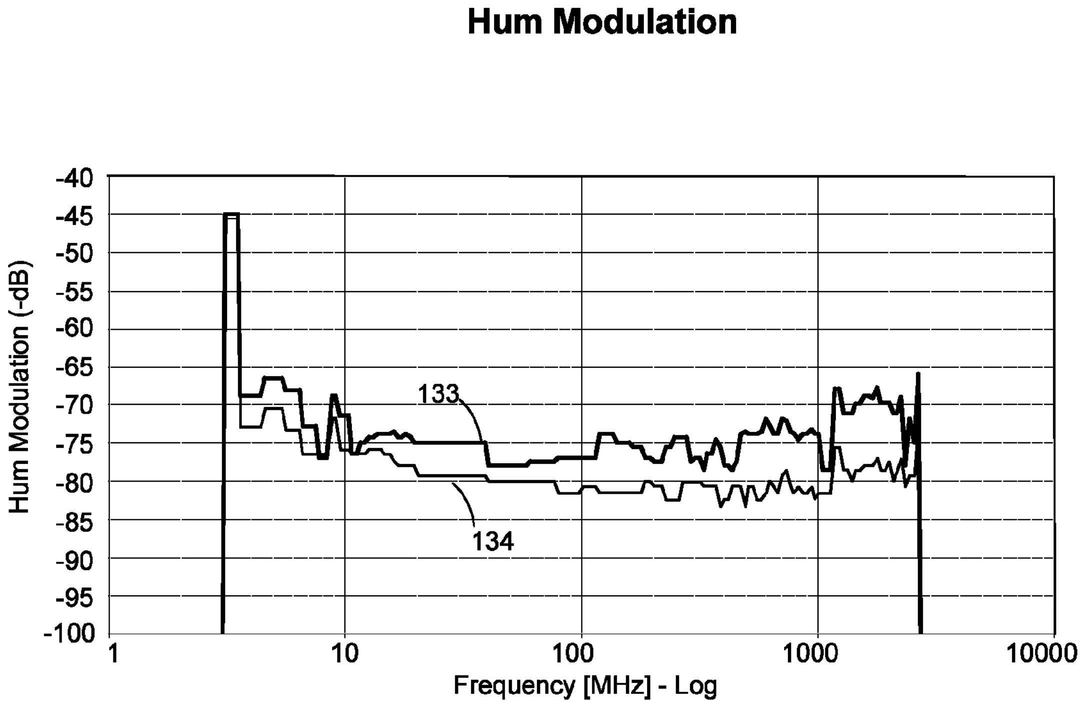
FIG. 10 is a graph of the Hum modulation versus frequency of a power coupler according to embodiments of the present invention.

Referring to FIG. 9 there is shown a graph of a prototype of embodiment of the power coupler main line IN to main line OUT 130 insertion loss (S21) versus the operational frequency 5 to 2750 MHz. The loss is relatively low and the return loss S11 main line IN 131 and main line OUT 132 is good. At higher frequencies the insertion loss is slightly degraded but this is expected since the prototype built for testing required additional tuning FIG. 10 shows a graph of the hum modulation of a prototype of embodiment of the power coupler main line IN to main line OUT where the HUM modulation test results shown over the operational frequency 5 to 2750 MHz. Setup for measuring hum modulation are generally known in the art. An example of this setup is described in "Test procedure for hum modulation" ANSI/SCTE 16/2001 published by the Society of Cable and Telecommunication Engineers (SCTE). It should be noted this test procedure relates to legacy frequency range of 5 to 1000 MHz and embodiments of the invention including the power coupler designed for 5 to 3000 MHz. The hum modulation refers to unwanted modulation of the RF signal caused by the AC power. This unwanted modulation cause distortion and degrade the quality of service of the content carried by the RF signals therefore should kept as low as possible. The reason of this distortion is the high AC current up to 15 A 60 Hz flows through the center conductor of the coaxial structure cause saturation of the magnetic ferrite material 68 and 70 in FIG. 6A part of the BALUN. This hum modulation saturation exists with RF chocks used in prior arts as well. The graph in FIG. 10 shows relatively low hum modulation test results (curve 134) with currents of 5 A and another result (curve 133) for a current of 10 A.

Figure 11:
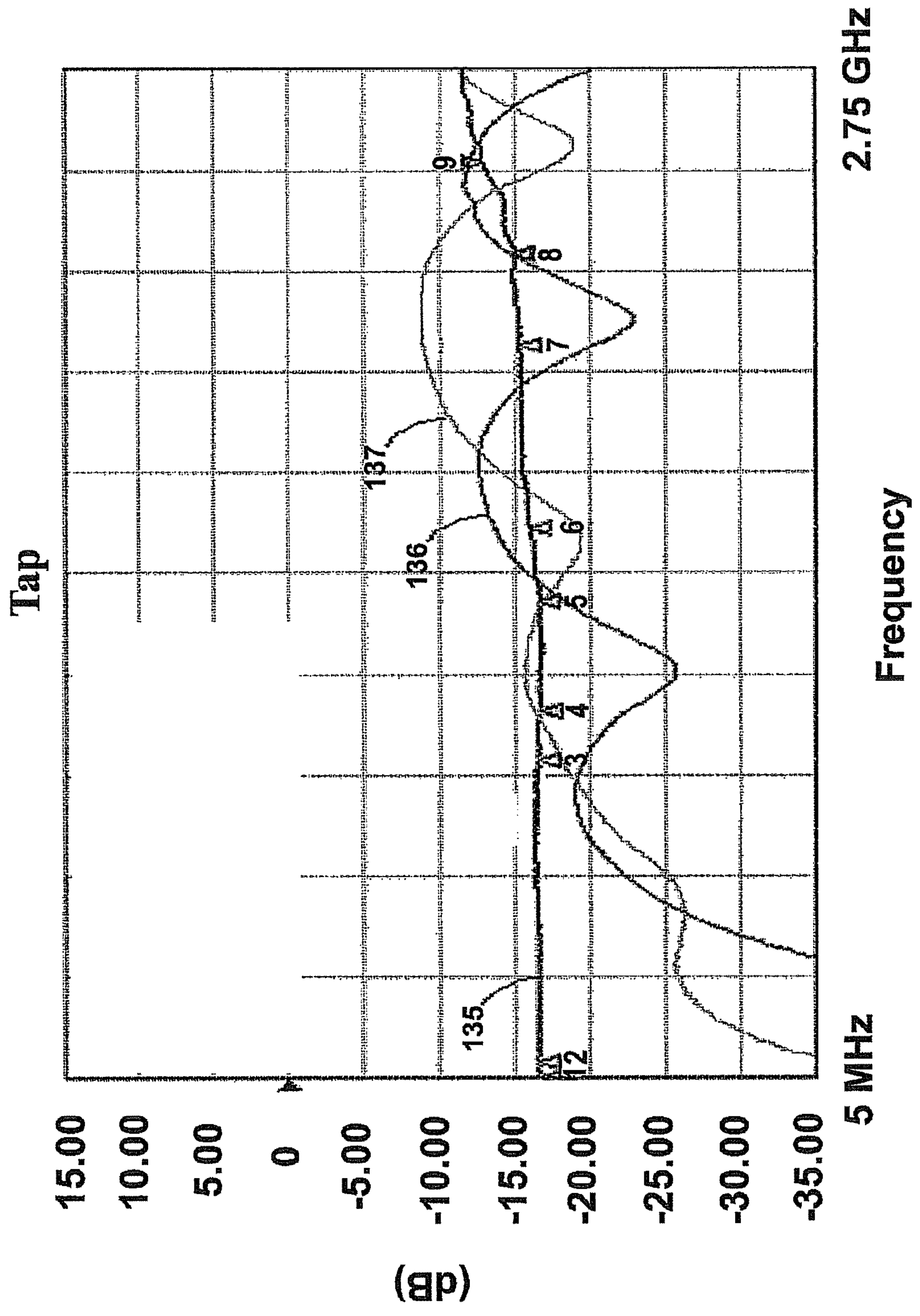
FIG. 11 is a graph of the TAP insertion loss versus frequency of a power coupler of embodiments of the present invention.

FIG. 11 shows a graph of a prototype of embodiment of the power coupler main line IN to TAP port insertion loss 135 versus the operational frequency 5 to 2750 MHz. The loss shown here is related to 16 dB coupling ratio selected parts as shown in table 1. Different values may be selected according to table 1 providing the required coupling ratio. The loss shown is relatively flat and close to the required 16 dB coupling ratio over the tested frequency range 5 to 2750 MHz.

Figure 12:
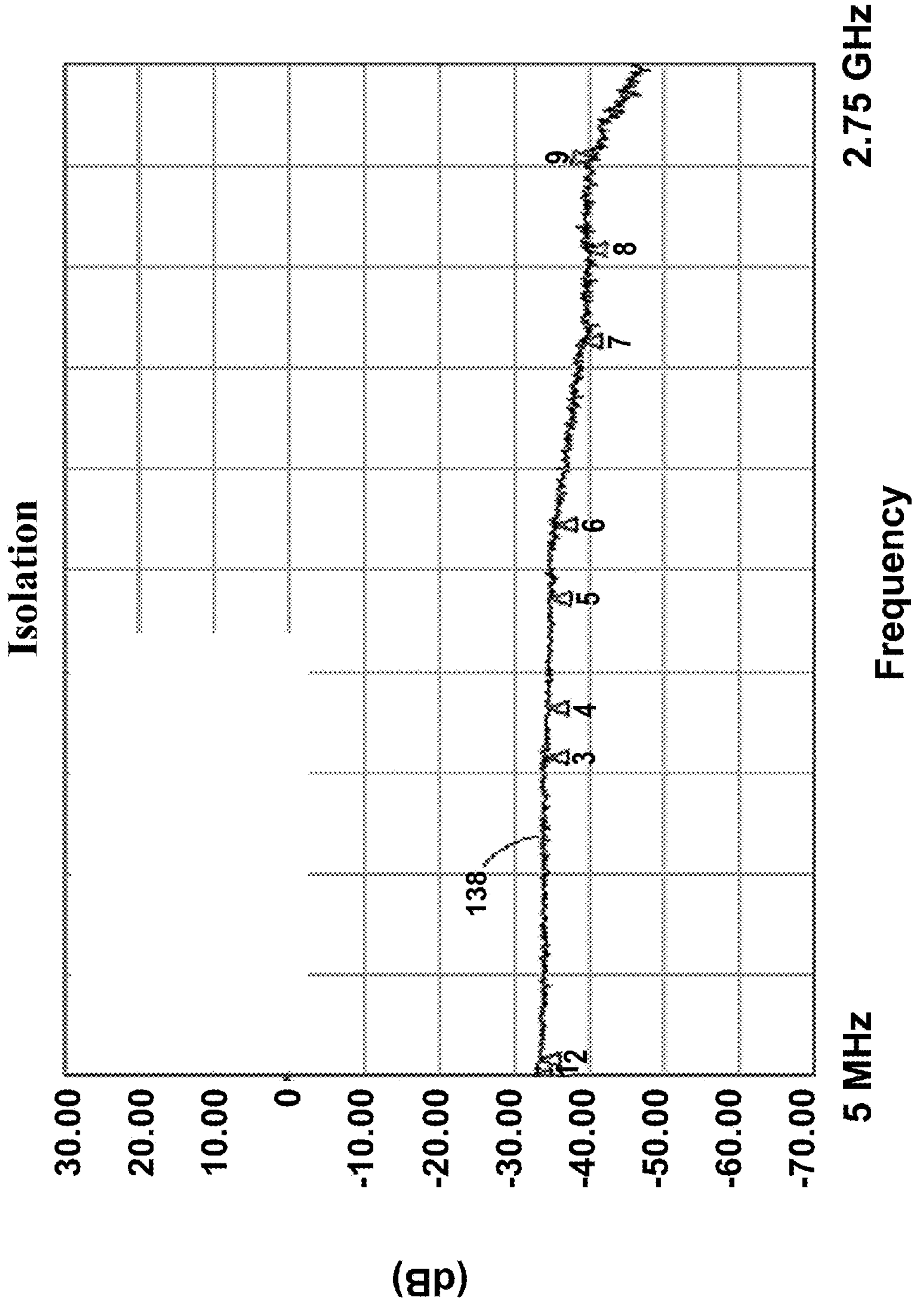
FIG. 12 is a graph of the TAP to main line OUT isolation versus frequency of a power coupler of embodiments of the present invention.

FIG. 12 shows a graph of the complete 4 way multi tap main line OUT to TAP port isolation versus the operational frequency 5 to 2750 MHz as shown in FIG. 3 port 35 to one of the tap ports 38 39 40 41. The isolation shown here is related to embodiment of a power coupler with 16 dB coupling ratio selected parts as shown in table 1 and integrated with a complete 4 way multi tap device. Different values may be selected according to table 1 providing the required coupling ratio. The isolation shown is relatively high and flat across the tested frequency range 5 to 2750 MHz.

Figure 13:
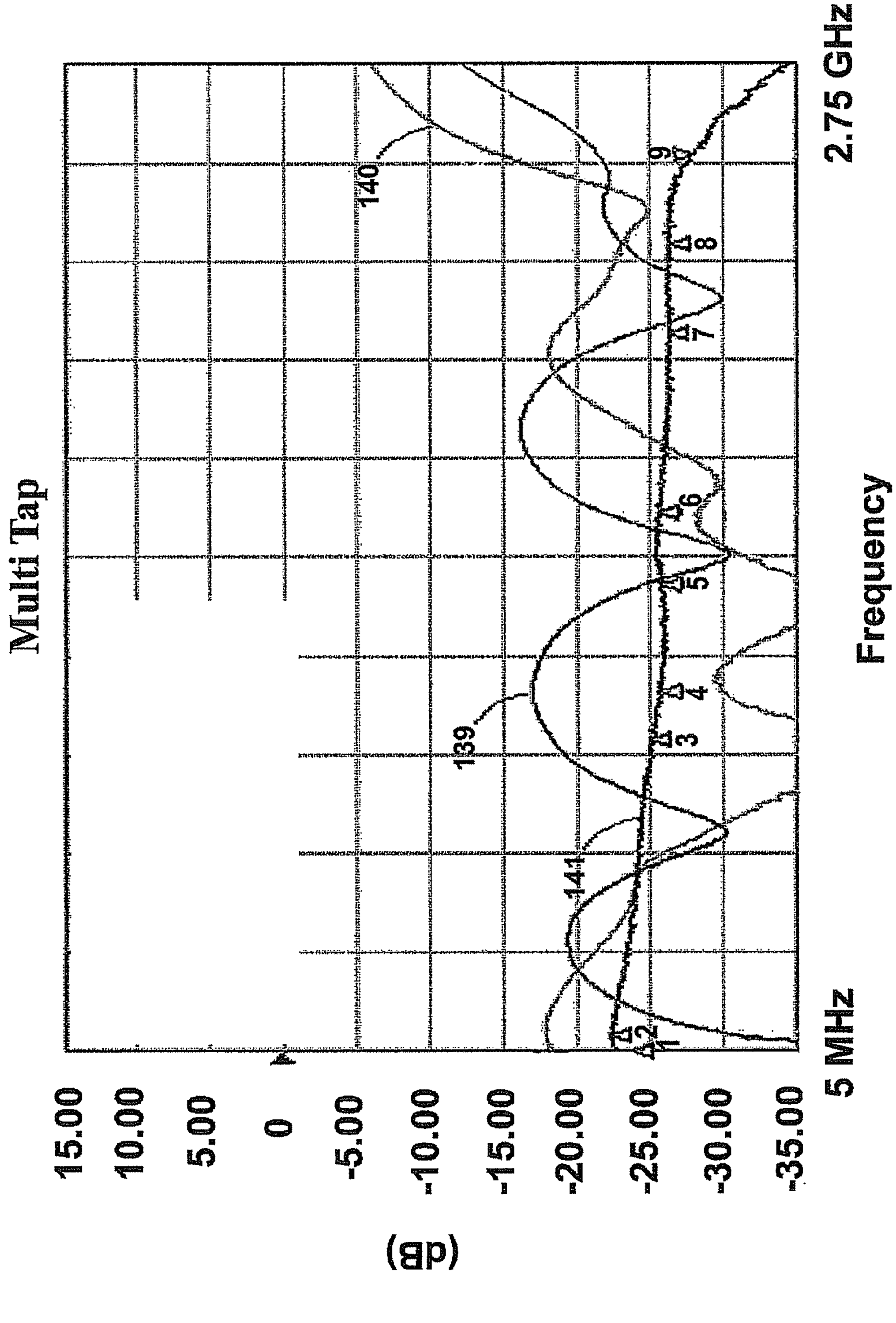
FIG. 13 is a graph of a four way multi tap main line IN to TAP port insertion loss versus frequency of a power coupler of embodiments of the present invention.

FIG. 13 shows a graph of the complete 4 way multi tap main line IN to TAP port insertion loss 141 versus the operational frequency 5 to 2750 MHz as shown in FIG. 3 port 33 to one of the tap ports 38, 39, 40 and 41. The loss shown here is related to an embodiment of a power coupler with 16 dB coupling ratio selected parts as shown in table 1 and integrated with a complete 4 way multi tap device. Different values may be selected according to table 1 providing the required coupling ratio. The loss shown is relatively flat and close to the required 16 dB coupling ratio cascaded with the hierarchical splitting section 37 in FIG. 3 over the tested frequency range 5 to 2750 MHz. The return loss S11 of the main line IN 139 and the S22 return loss 140 relates to one of the tap ports 38, 39, 40 and 41 in FIG. 3 is relatively good.

Figure 14A:
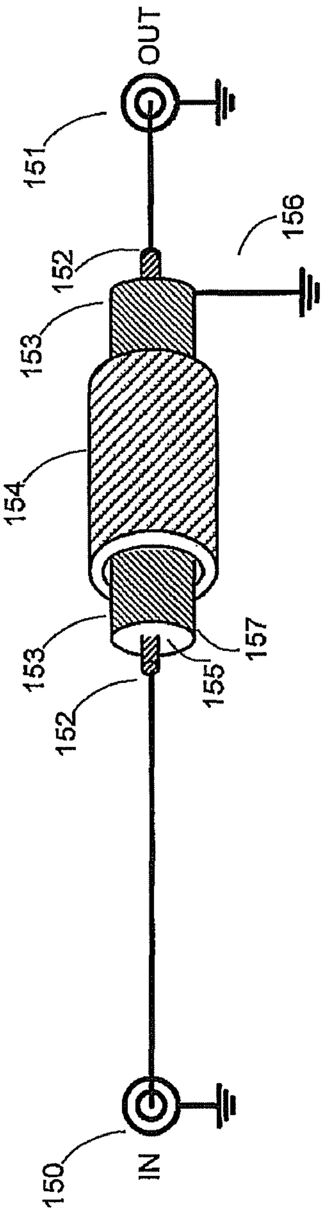
FIGS. 14A and 14B illustrate the BALUN part of a power coupler according to embodiments of the present invention and the BALUN detailed equivalent schematic diagram, respectively.
Figure 14B:
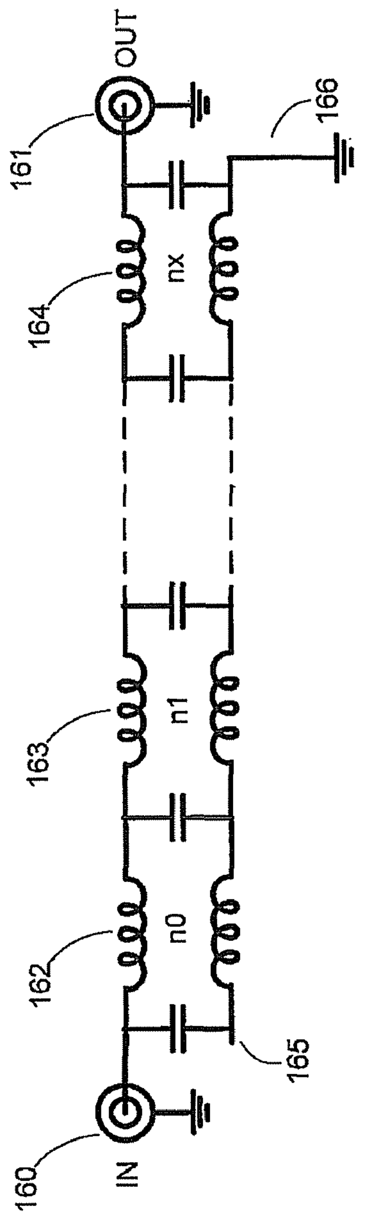

FIG. 14A illustrates the BALUN, which is part of the power coupler of embodiments of the present invention. FIG. 14B illustrates the BALUN detailed equivalent schematic diagram. The combined RF signal and AC power may be applied to main line IN connector 150 and may flow through center conductor 152 to the main line output connector 151. The center conductor 152 is a part of the wideband balanced to unbalanced structure usually called BALUN, which includes the center conductor 152 the outer conductor 153, the insulator 155 and the ferrite cylinder element 154. The outer conductor 153 is connected to electrical ground via conductor 156 at the end proximate to the main line OUT connector 151. At the other end, i.e., proximate outer conductor 153, near main line IN connector 150, outer conductor 153 may be connected at 157 to resistor 53 and the other circuits as shown in FIG. 4.

The voltage developed over the BALUN and its wideband operational bandwidth (1000 times wider than prior art BALUNs) may be better understood through analysis of the equivalent circuit also shown in FIG. 14B. The schematic diagram shows the BALUN structure divided into sections and connected in series. Each section is built from two series inductors where one inductor represents the inner conductor and the other inductor represents the outer conductor. The capacitors connected between the sections all representing the coaxial structure. Each section covers about one octave which is part of the overall 5 to 3000 MHz operational frequency range. Starting with nO the first section 162 has a frequency range of about 1500 to 3000 MHz and is schematically positioned closer to point 165 which is connected to resistor 53 and related circuit components as shown in FIG. 4. The second section n1 is section 163 which covers the second frequency range of about 750 to 1500 MHz. The dotted lines represent other sections that cover lower frequency ranges down to about 5 MHz which is the lowest operating frequency of the BALUN. The last section 164 which covers the lowest frequency range of about 5 to 10 MHz is connected to electrical ground 166 and to OUT connector 161 at the unbalanced side of the BALUN. There may be 9 sections, for example, required to cover the full operational frequency range of the BALUN about 5 to 3000 MHz.

Figure 15:
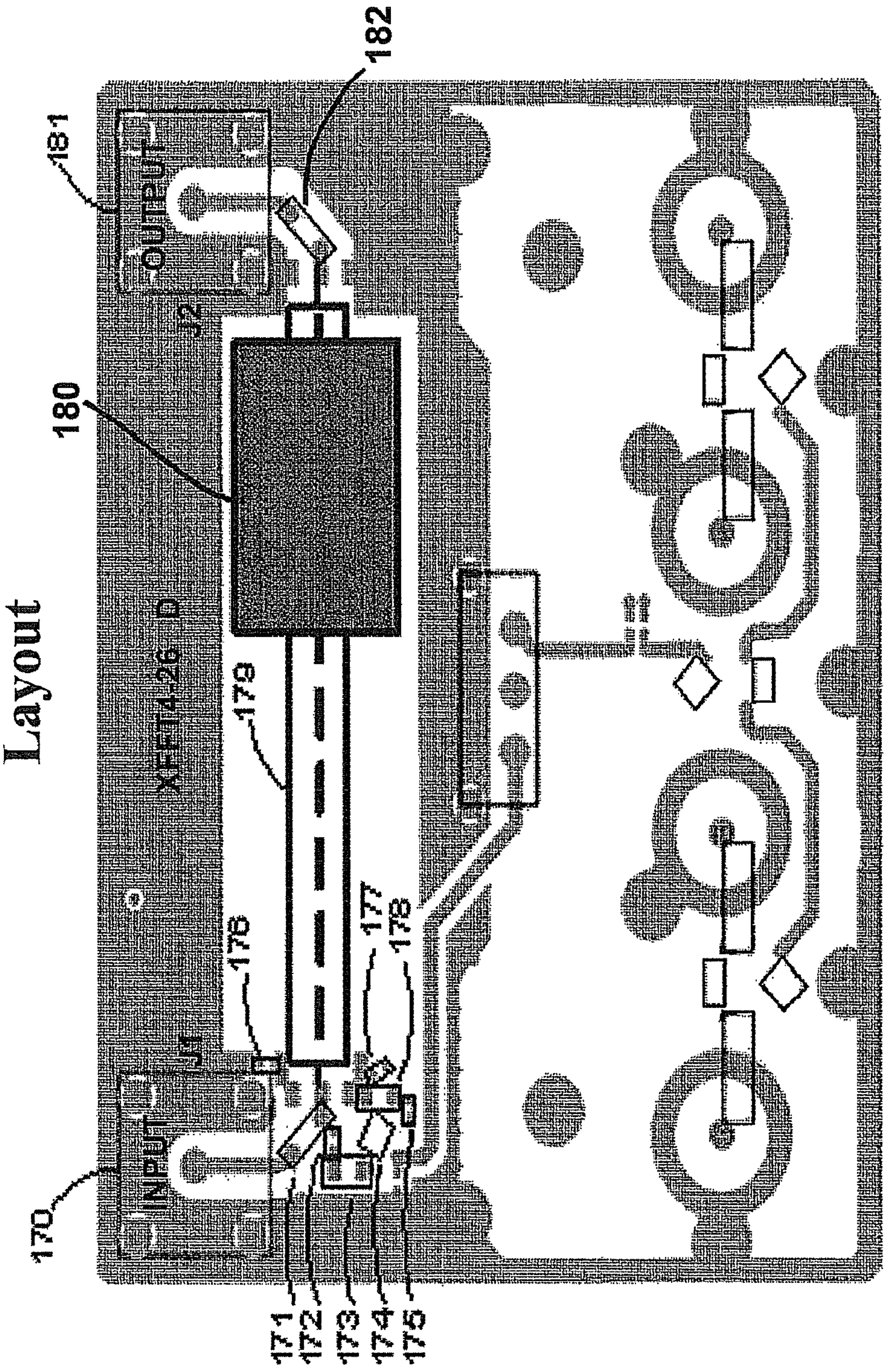
FIG. 15 illustrates an exemplary layout of a complete multi tap printed circuit board (PCB) according to embodiments of the present invention.

FIG. 15 illustrates an exemplary layout of the complete multi tap printed circuit board. This is a detailed view of the parts placements on the PCB 122 of FIG. 8. The IN connector 45 of FIG. 4 corresponds to connector 170 in FIG. 15. A small jumper 171 footprint may be used also as small value inductor (i.e., a few nano Henries) for impedance matching at relatively high frequencies (not shown in the schematic FIG. 4). The various resistors, capacitors and other circuit parts shown in the circuit of FIG. 4 are shown as components on the printed circuit board of FIG. 15. In particular, Resistor 56 corresponds to component 172 of FIG. 15. Capacitor 57 corresponds to component 173 of FIG. 15. Transformer 43 corresponds to component 174 of FIG. 15. Resistor 53 corresponds to component 177 and 176 placed in parallel where they both represent the required value of Resistor 53. Capacitor 54 corresponds to component 178. Resistor 55 corresponds to component 175. The BALUN comprises center conductor 47 and outer conductor 48 which shown as component 179. The ferrite element 49 corresponds to component 180. Another small jumper 182 footprint may be used also as small valued inductor (a few nano henries) for impedance matching at high frequencies (not shown in the schematic FIG. 4). OUT connector 50 corresponds to component 181. It may be clear to those skilled in the art that other layouts may accommodate the multi tap printed circuit board.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A BALUN comprising:

a coaxial structure comprising:

a central conductor to allow a first signal and part of a second signal to flow thorough; and an outer conductor, enclosing at least partially said central conductor, grounded at one side to reflect part of said second signal at substantially 180 degrees phase shift with respect to said first signal; and a first cylindrical ferrite element enclosing at least part of said coaxial structure to increase the inductance of said coaxial structure, wherein the length of said BALUN is about ½ wavelength of the highest frequency of the frequency range of said second signal and wherein said first signal is an up to 15 A and 50 to 60 Hz AC signal and said frequency range of said second signal is at least 5 MHz to 3000 MHz RF.

2. The BALUN of claim 1, wherein the relative permeability of said first cylindrical ferrite element is in the range of 850-1500.

3. The BALUN of claim 1, wherein said first cylindrical ferrite element to remain unsaturated with said first signal.

4. The BALUN of claim 1, wherein said first cylindrical ferrite element comprises an air gap to limit the magnetic flux saturation level and reduce hum modulation.

5. The BALUN of claim 1, wherein said first cylindrical ferrite element is made of a material chosen from a list comprising:

STEWARD 28 and STEWARD 46.

6. The BALUN of claim 1, wherein the impedance of said BALUN substantially equals 75 ohms and the overall inductance of said BALUN substantially equals 2 uH.

7. The BALUN of claim 1, wherein the general shape of said BALUN is selectable from a list comprising: straight-line and U-shaped.

8. The BALUN of claim 1, wherein isolators made of low loss and high isolation material are placed on the edges of said coaxial structure keeping air as insulator between said central conductor, said outer conductor and said first cylindrical ferrite.

9. The BALUN of claim 1, further comprising a second cylindrical ferrite element having higher permeability than said first cylindrical ferrite element to operate in frequency range of 5 to 50 MHz.

10. The BALUN of claim 9 wherein said second cylindrical ferrite element comprising an air gap to improve saturation level and reduce hum modulation.

11. The BALUN of claim 9, wherein the relative permeability of said second cylindrical ferrite element is in the range of 1500 -4000.

12. The BALUN of claim 9, wherein said second cylindrical ferrite element is made of a material chosen form a list comprising: STEWARD 28 and STEWARD 46.

13. A power coupler for taping part of a RF signal from a combined RE and AC signal, the power coupler comprising:

a main line input port to receive a downstream signal from an input signal source, said downstream signal comprising a combined AC component and RF signal;

a BALUN comprising:

a coaxial structure comprising:

a central conductor to allow a first signal and part of a second signal to flow thorough; and an outer conductor, enclosing at least partially said central conductor, grounded at one side to reflect part of said second signal at substantially 180 degrees phase shift with respect to said first signal;

a first cylindrical ferrite element enclosing at least part of said coaxial structure to increase the inductance of said coaxial structure, wherein the length of said BALUN is about ½ wavelength of the highest frequency of the frequency range of said second signal, wherein the first port of the central conductor of said BALUN is connected to said input port and the second port is connected to a main line output port, to allow said AC component and part of said RF signal to flow thorough said BALUN central conductor and to reflect part of said RF signal at substantially 180 degrees phase shift with respect to said RF signal on said BALUN outer conductor, wherein said BALUN outer conductor is coupled to a second circuitry;

a first circuitry coupled to said input port and to said first port of said BALUN central conductor to sample small part of said RF signal;

said main line output port to receive said AC component and part of said RF signal to feed a main line distribution cable;

said second circuitry, coupled to said BALUN outer conductor, to match impedances and improve the return loss of said RF signal and to pass said reflected RE signal to a third circuitry;

said third circuitry coupled to said second circuitry and to said first circuitry to reverse the phase of said reflected RF signal received from said second circuitry and sum the reversed signal with the RF signal received from said first circuit and feed an output tap port with the summed RF signal; and an output tap port to feed splitting devices with said summed RF signal for the distribution of said summed RF signal to subscribers drop lines.

14. The power coupler of claim 13, wherein RF signals reflected on said BALUN outer conductor from an upstream signal are substantially in the same phase as the RF signals sampled by said first circuitry from said upstream signal, such that they are substantially canceled by said third circuitry.

15. The power coupler of claim 13, wherein said first cylindrical ferrite element of said BALUN comprises an air gap to limit the magnetic flux saturation level and reduce hum modulation.

16. The power coupler of claim 13, wherein said first circuitry comprising a high pass filter comprising a first resistor and a first capacitor, and wherein said second circuitry comprising a network of capacitors and resistors, said network comprising a second resistor connected to ground and a high pass filter comprising a third resistor and a second capacitor, and wherein said third circuitry comprising an autotransformer.

17. The power coupler of claim 16, wherein values of attenuation and output TAP impedance of said power coupler are determined at least by the values of said first, second and third resistors and primary to secondary windings ratio of said autotransformer, wherein the possible values together with the corresponding attenuation are selectable from the following table:

| | Attenuation | | | | |
|---|---|---|---|---|---|
| Parts | 4.5 dB | 8 dB | 10 dB | 13 dB | 16 dB |
| Transformer Turns Ratio | 1/1 | 1/1.5 | 1/2 | 1/3.5 | 1/4.5 |
| First resistor Ω | 0 | 60 | 60 | 60 | 82 |
| Second resistor Ω | 27 | 56 | 106 | 106 | 118 |
| Third resistor Ω | 33 | 31 | 21.5 | 15 | 10.5 |
| Output tap imp Ω | 37.5 | 75 | 75 | 75 | 75 |

18. The power coupler of claim 16, wherein said first capacitor is selectable from a list comprising: 1000 pF polyester or 1000 pF COG ceramic capacitors.

19. The power coupler of claim 13, wherein said AC signal is an up to 15 A and 50 to 60 Hz AC signal and aid RF signal is at least 5 MHz to 3000 MHz signal.

20. The power coupler of claim 13, to be used in a Cable TV network.

21. A method for tapping part of a RF signal from a combined RF and AC signal, the method comprising:

providing a BALUN comprising:

a coaxial structure comprising:

a central conductor to allow a first signal and part of a second signal to flow thorough; and an outer conductor, enclosing at least partially said central conductor, grounded at one side to reflect part of said second signal at substantially 180 degrees phase shift with respect to said first signal;

a first cylindrical ferrite element enclosing at least part of said coaxial structure to increase the inductance of said coaxial structure$_s$ wherein the length of said BALUN is about ½ wavelength of the highest frequency of the frequency range of said second signal;

receiving a downstream signal from an input signal source, said downstream signal comprising a combined AC component and a RF signal component;

allowing said AC component and part of said RF signal to flow thorough the BALUN central conductor to create an output downstream signal;

feeding a main line distribution cable with said output downstream signal;

reflecting part of said RF signal at substantially 180 degrees phase shift with respect to said RF signal on said BALUN outer conductor to create a reflected RF signal;

sampling part of said RF signal using a first circuitry to create sampled RF signal;

matching impedances and reducing the return loss of said RF signal using a second circuitry;

reversing the phase of said reflected RF signal to create reversed RF signal; and summing said reversed RF signal with said sampled RE signal using a third circuitry to create a summed RF signal.

22. The method of claim 21 further comprising:

receiving an upstream signal, said upstream signal comprising a combined upstream AC component and upstream RF signal;

allowing said upstream AC component and part of said upstream RF signal to flow thorough said BALUN central conductor to create an output upstream signal;

feeding a main line distribution cable with said output upstream signal;

reflecting part of said RE signal of said upstream signal at substantially 0 degrees phase shift on said BALUN outer conductor to create an upstream reflected RF signal;

sampling small part of said upstream RE signal using said first circuitry to create sampled upstream RF signal;

reversing the phase of said reflected upstream RE signal to create a reversed upstream RF signal; and summing said reversed upstream RF signal with said sampled upstream RF signal to substantially cancel said upstream RF signal at the output tap port.

23. The power coupler of claim 21, wherein said first cylindrical ferrite element of said BALUN comprises an air gap to improve saturation level and reduce hum modulation.

24. The method of claim 21, wherein said summed RF signal is feed to splitting devices of Cable TV distribution systems.

25. The method of claim 21, wherein said first circuitry comprising a high pass filter comprising a first resistor and a first capacitor, and wherein said second circuitry comprising a network of capacitors and resistors, said network comprising a second resistor connected to ground and a high pass filter comprising a third resistor and a second capacitor, and wherein said third circuitry comprising an autotransformer.

26. The method of claim 21, further to attenuate said upstream RF signal in a level determined by the values of said first, second and third resistors and primary to secondary windings ratio of said autotransformer, wherein the possible values together with the corresponding attenuation levels and output tap impedances are selectable from the following table:

| | Attenuation | | | | |
|---|---|---|---|---|---|
| Parts | 4.5 dB | 8 dB | 10 dB | 13 dB | 16 dB |
| Transformer Turns Ratio | 1/1 | 1/1.5 | 1/2 | 1/3.5 | 1/4.5 |
| First resistor Ω | 0 | 60 | 60 | 60 | 82 |
| Second resistor Ω | 27 | 56 | 106 | 106 | 118 |
| Third resistor Ω | 33 | 31 | 21.5 | 15 | 10.5 |
| Output tap imp Ω | 37.5 | 75 | 75 | 75 | 75 |

27. The method of claim 25, wherein said first capacitor is selectable from a list comprising: 1000 pF polyester or 1000 pF COG ceramic capacitors.

28. The method of claim 21, wherein said AC component is an up to 15 A, 50 to 60 Hz AC signal and aid RF signal is at least 5 MHZ to 3000 MHz signal.

* * * * *